US011088065B2

(12) United States Patent
Oji

(10) Patent No.: US 11,088,065 B2
(45) Date of Patent: Aug. 10, 2021

(54) SEMICONDUCTOR DEVICE

(71) Applicant: ROHM CO., LTD., Kyoto (JP)

(72) Inventor: Hiroshi Oji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 6 days.

(21) Appl. No.: 16/703,096

(22) Filed: Dec. 4, 2019

(65) Prior Publication Data

US 2020/0294902 A1    Sep. 17, 2020

(30) Foreign Application Priority Data

Mar. 11, 2019    (JP) .............................. JP2019-043504

(51) Int. Cl.
| | | |
|---|---|---|
| *H01L 23/498* | (2006.01) | |
| *H01L 23/31* | (2006.01) | |
| *H01L 23/00* | (2006.01) | |

(52) U.S. Cl.
CPC .... *H01L 23/49838* (2013.01); *H01L 23/3121* (2013.01); *H01L 23/49811* (2013.01); *H01L 24/08* (2013.01); *H01L 2224/08238* (2013.01)

(58) Field of Classification Search
CPC ........... H01L 23/49838; H01L 23/3121; H01L 23/49811; H01L 24/08; H01L 2224/08238
See application file for complete search history.

(56) References Cited

U.S. PATENT DOCUMENTS

| | | | | |
|---|---|---|---|---|
| 2010/0140800 A1* | 6/2010 | Hagihara | ............. | H05K 1/0271 |
| | | | | 257/737 |
| 2013/0001792 A1* | 1/2013 | Uno | ................. | H01L 23/49575 |
| | | | | 257/773 |
| 2017/0317000 A1* | 11/2017 | Nishimura | .............. | H01L 23/13 |
| 2018/0108582 A1* | 4/2018 | Yanagida | .......... | H01L 21/02013 |
| 2018/0331008 A1* | 11/2018 | Nishimura | .............. | H01L 23/28 |

FOREIGN PATENT DOCUMENTS

JP    2011181970 A    9/2011

* cited by examiner

*Primary Examiner* — Herve-Louis Y Assouman
(74) *Attorney, Agent, or Firm* — Hamre, Schumann, Mueller & Larson, P.C.

(57) ABSTRACT

A semiconductor device comprising: substrate having main surface facing thickness direction; wirings arranged on main surface; semiconductor element having back surface facing the main surface and electrodes formed on back surface, wherein the electrodes are bonded to the wirings; and columnar wirings located outside the semiconductor element as viewed along the thickness direction, protrude in direction away from the main surface in the thickness direction, and are arranged on the wirings, wherein the semiconductor element includes first circuit and second circuit, wherein the electrodes include first electrodes electrically connected to the first circuit and second electrodes electrically connected to the second circuit, wherein the columnar wirings include first columnar portions electrically connected to the first electrodes and second columnar portions electrically connected to the second electrodes, and wherein area of each first columnar portions is larger than area of each second columnar portions in the thickness direction.

19 Claims, 16 Drawing Sheets

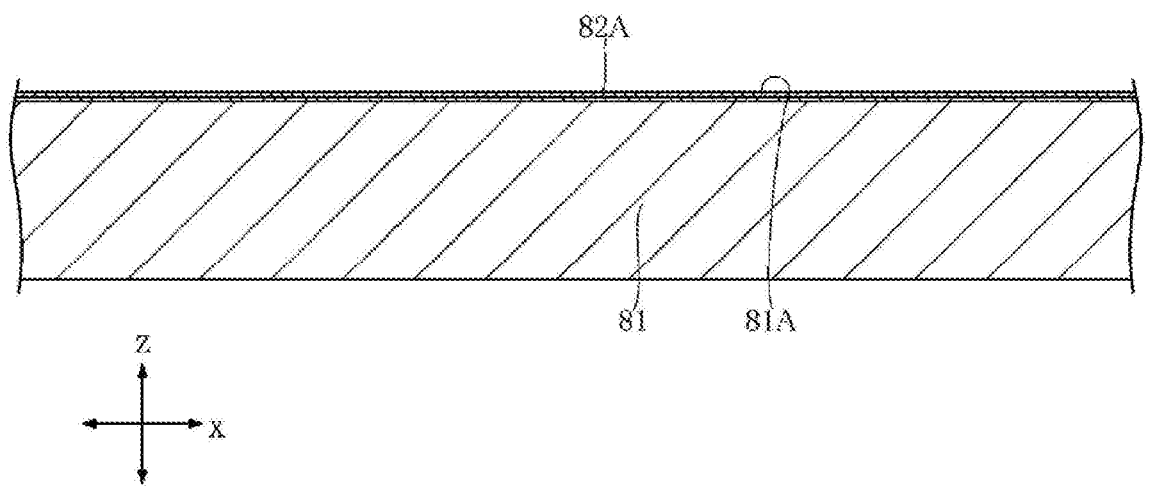
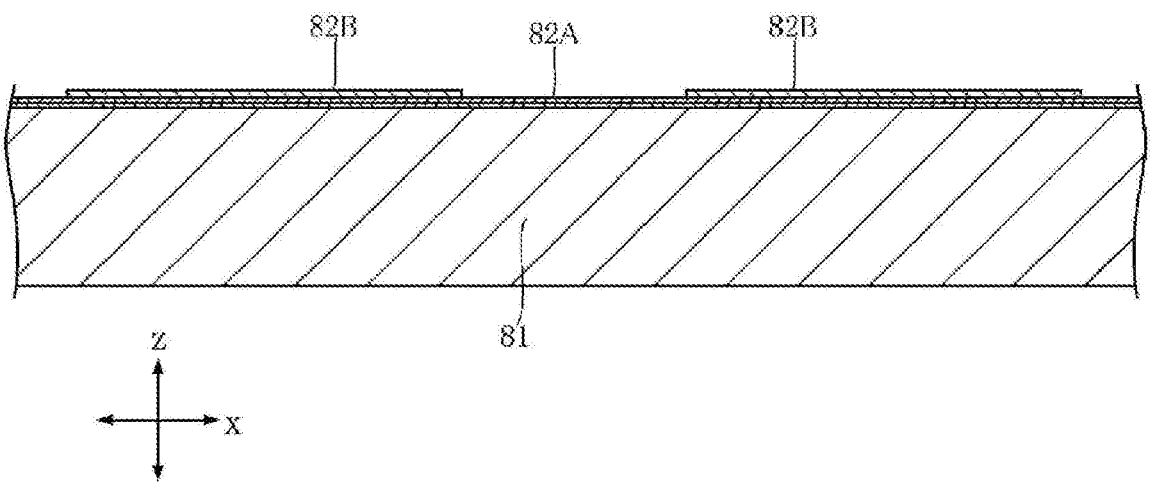

SEMICONDUCTOR DEVICE

CROSS-REFERENCE TO RELATED APPLICATION

This application is based upon and claims the benefit of priority from Japanese Patent Application No. 2019-043504, filed on Mar. 11, 2019, the entire contents of which are incorporated herein by reference.

TECHNICAL FIELD

The present disclosure relates to a semiconductor device which includes a semiconductor element in which a switching circuit is mainly configured and whose package type is QFN.

BACKGROUND

A semiconductor device which includes a semiconductor element in which a switching circuit is configured is known in the related art. A package type of the semiconductor device is a quad flat non-leaded package (QFN) characterized in that a plurality of leads do not protrude from a sealing resin covering the semiconductor element. When the semiconductor device is mounted on a target wiring board, QFN has an advantage that a mounting area is reduced.

In the semiconductor device known in in the related art, the semiconductor element in which the switching circuit is configured is mounted on a lead frame. In addition, instead of a plurality of wirings, plate-like leads are bonded to terminals formed on the upper surface of the semiconductor element. Thus, the semiconductor device has a configuration suitable for flowing a relatively large current. However, in such a configuration of the semiconductor device, a thickness of the device tends to be relatively large due to the hierarchical structure of the semiconductor element and the plate-like leads. For this reason, it is required to achieve the low profile of the device while adopting a configuration suitable for flowing a relatively large current.

SUMMARY

Some embodiments of the present disclosure provide a semiconductor device capable of achieving a low profile of the device while employing a configuration suitable for flowing a relatively large current.

According to one embodiment of the present disclosure, there is provided a semiconductor device including: a substrate having a main surface facing a thickness direction; a plurality of wirings arranged on the main surface; a semiconductor element having a back surface facing the main surface and a plurality of electrodes formed on the back surface, wherein the plurality of electrodes are bonded to the plurality of wirings; and a plurality of columnar wirings that are located outside the semiconductor element as viewed along the thickness direction, protrude in a direction away from the main surface in the thickness direction, and are arranged on the plurality of wirings, wherein the semiconductor element includes a first circuit and a second circuit electrically connected to the first circuit, wherein the plurality of electrodes include a plurality of first electrodes electrically connected to the first circuit and a plurality of second electrodes electrically connected to the second circuit, wherein the plurality of columnar wirings include a plurality of first columnar portions electrically connected to the plurality of first electrodes and a plurality of second columnar portions electrically connected to the second electrodes, and wherein an area of each of the plurality of first columnar portions is larger than an area of each of the plurality of second columnar portions when viewed along the thickness direction.

In some embodiments, the first circuit may include a plurality of switching circuits.

In some embodiments, a plurality of currents having different magnitudes may be output from the plurality of switching circuits.

In some embodiments, the second circuit may include a control circuit.

In some embodiments, the plurality of first columnar portions may be located on both sides of the semiconductor element in a first direction orthogonal to the thickness direction, and may be arranged along a second direction orthogonal to both of the thickness direction and the first direction.

In some embodiments, in each of the plurality of first columnar portions, a dimension in the first direction may be larger than a dimension in the second direction.

In some embodiments, each of the plurality of first columnar portions may have a rectangular shape when viewed along the thickness direction.

In some embodiments, the plurality of second columnar portions may be located on both sides of the semiconductor element and of the plurality of first columnar portions in the second direction, and may be arranged along the first direction.

In some embodiments, wherein the plurality of second columnar portions may include four corner portions located at the four corners of the main surface, and include a plurality of intermediate portions located between a pair of corner portions, which are located on one side or the other side in the second direction, among the four corner portions, and an area of each of the four corner portions is larger than an area of each of the plurality of intermediate portions when viewed along the thickness direction.

In some embodiments, the plurality of wirings may include a plurality of first wirings to which the plurality of first electrodes are bonded and on which the plurality of first columnar portions are arranged, and include a plurality of second wirings to which the plurality of second electrodes are bonded and on which the plurality of second columnar portions are arranged, and a width of each of the plurality of first wirings in a section from any one of the plurality of first electrodes to any one of the plurality of first columnar portions may be larger than a width of each of the plurality of second wirings in a section from any one of the plurality of second electrodes to any one of the plurality of second columnar portions.

In some embodiments, each of the plurality of first wirings may extend in the first direction.

In some embodiments, wherein at least one of the plurality of first wirings may have a slit passing through the at least one of the plurality of first wirings in the thickness direction, and the slit may extend in the first direction from an inner edge located at an end of any one of the plurality of first wirings in the first direction.

In some embodiments, the plurality of first electrodes bonded to any one of the plurality of first wirings having the slit may be located on both sides in the second direction with the slit interposed between the first electrodes.

In some embodiments, the semiconductor device may further includes: a sealing resin that is in contact with the main surface and covers the plurality of wirings, the semiconductor element and a portion of each of the plurality of columnar wirings, each of the plurality of columnar wirings may have a top surface facing the same side as the main surface, and the top surfaces of the plurality of columnar wirings may be exposed from the sealing resin.

In some embodiments, the plurality of columnar wirings may be located inward from the peripheral edges of both of the main surface and the sealing resin when viewed along the thickness direction.

In some embodiments, the semiconductor device may further includes: a plurality of terminals, and the plurality of terminals may be individually arranged on the top surfaces of the plurality of columnar wirings.

In some embodiments, the substrate may be made of a single crystal intrinsic semiconductor material.

Other features and advantages of the present disclosure will become more apparent from the detailed description given below with reference to the accompanying drawings.

BRIEF DESCRIPTION OF DRAWINGS

FIG. 10 is a sectional view for explaining a step of manufacturing the semiconductor device shown in FIG. 1.

FIG. 11 is a sectional view for explaining a step of manufacturing the semiconductor device shown in FIG. 1.

DETAILED DESCRIPTION

An embodiment for carrying out the present disclosure (hereinafter referred to as an "embodiment") will be described with reference to the accompanying drawings.

First Embodiment

Figure 1:
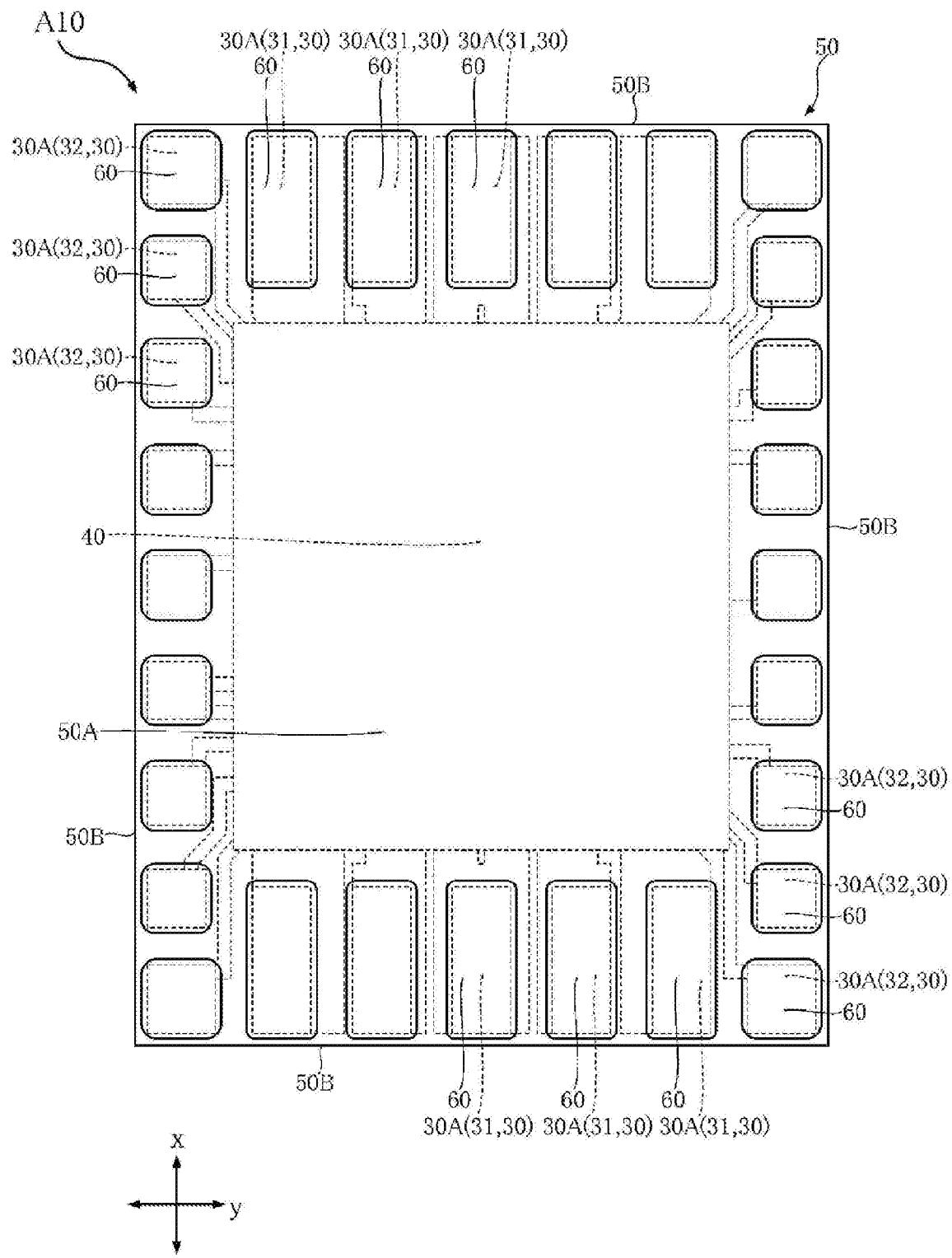
FIG. 1 is a bottom view of a semiconductor device according to a first embodiment of the present disclosure.
Figure 2:
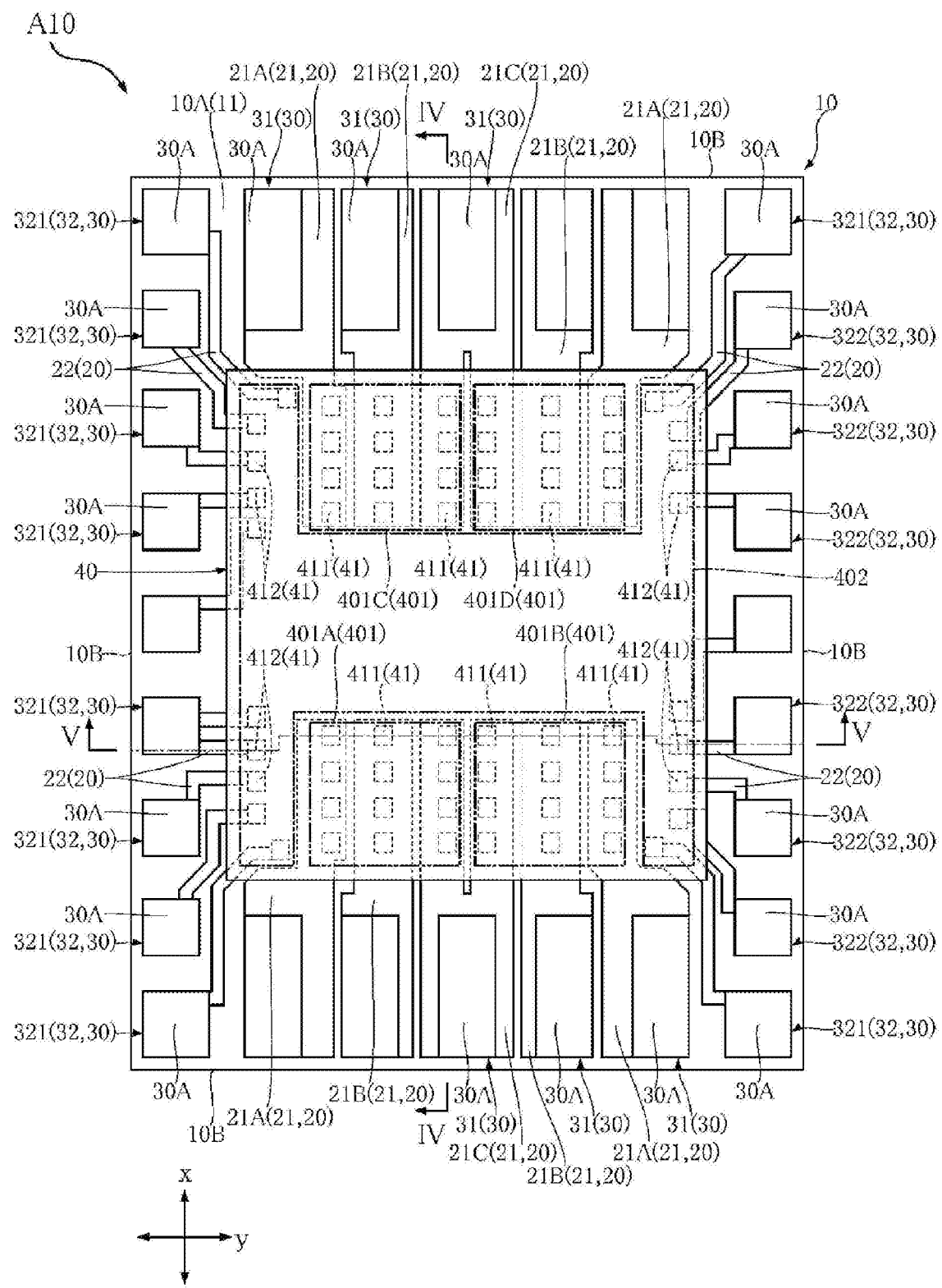
FIG. 2 is a bottom view in which a sealing resin and a plurality of terminals of FIG. 1 are penetrated.
Figure 3:
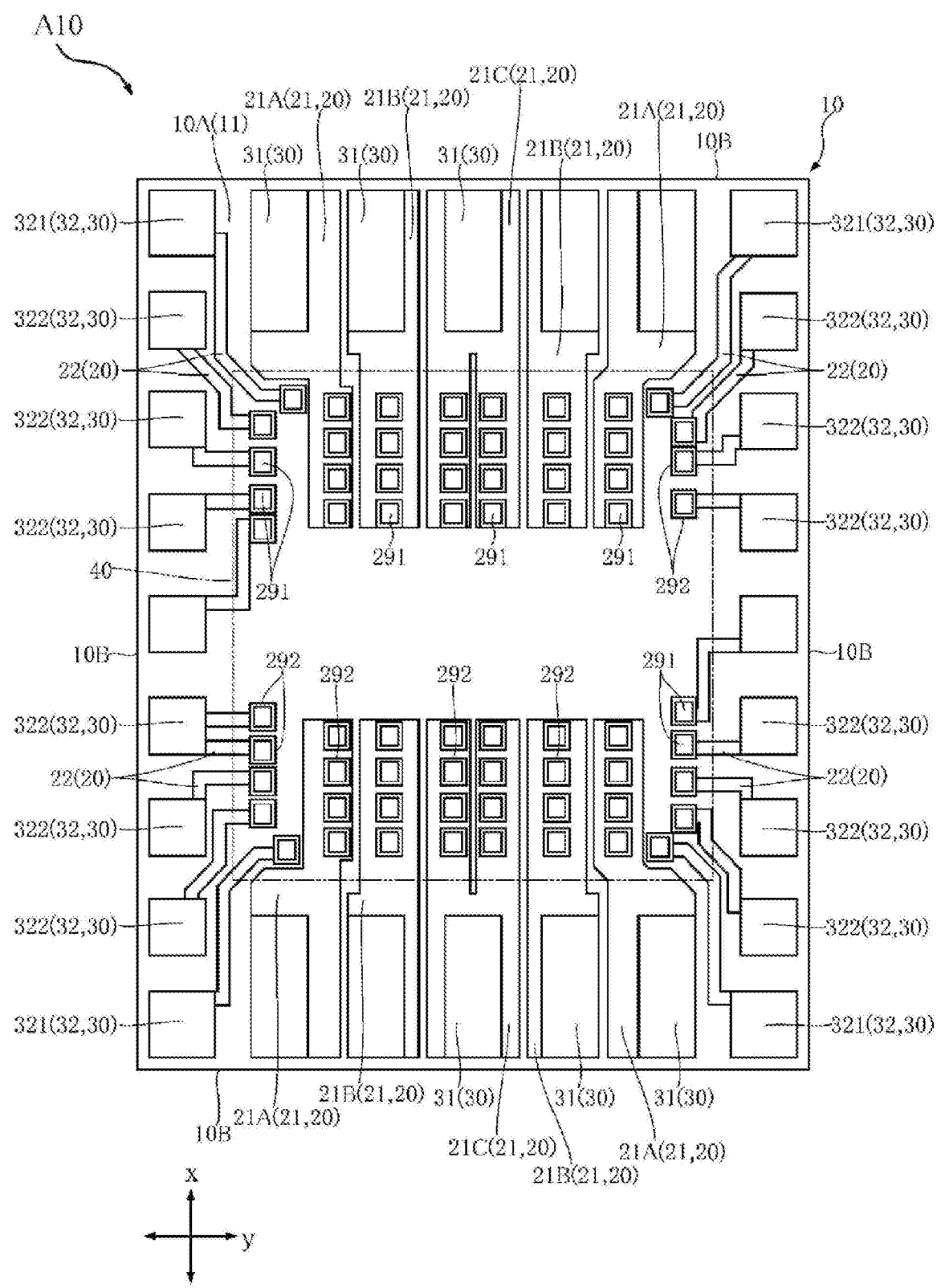
FIG. 3 is a bottom view in which a semiconductor element transparent of FIG. 2 is penetrated.

A semiconductor device A10 according to a first embodiment of the present disclosure will be described with reference to FIGS. 1 to 8. The semiconductor device A10 includes a substrate 10, a plurality of wirings 20, a plurality of columnar wirings 30, a semiconductor element 40, a sealing resin 50 and a plurality of terminals 60. The semiconductor device A10 shown in these figures constitutes a part of a power conversion device such as a DC/DC converter. The semiconductor device A10 is of a resin package type, which is surface-mounted on a wiring board of a target power conversion device. The package type is QFN. Here, in FIG. 2, the sealing resin 50 and the terminals 60 transparent of FIG. 1 are penetrated for convenience of understanding. In FIG. 3, the semiconductor element 40 of FIG. 2 is penetrated for convenience of understanding, and the penetrated semiconductor element 40 is indicated by an imaginary line (two-dot chain line). In FIG. 2, a V-V line is indicated by a one-dot chain line.

In the description of the semiconductor device A10, a thickness direction of the substrate 10 is referred to as a "thickness direction z." A direction orthogonal to the thickness direction z is referred to as a "first direction x." A direction orthogonal to both the thickness direction z and the first direction x is referred to as a "second direction y." As shown in FIG. 1, the semiconductor device A10 has a rectangular shape as viewed along the thickness direction z. The first direction x corresponds to a longitudinal direction of the semiconductor device A10. The second direction y corresponds to a transverse direction of the semiconductor device A10.

Figure 4:
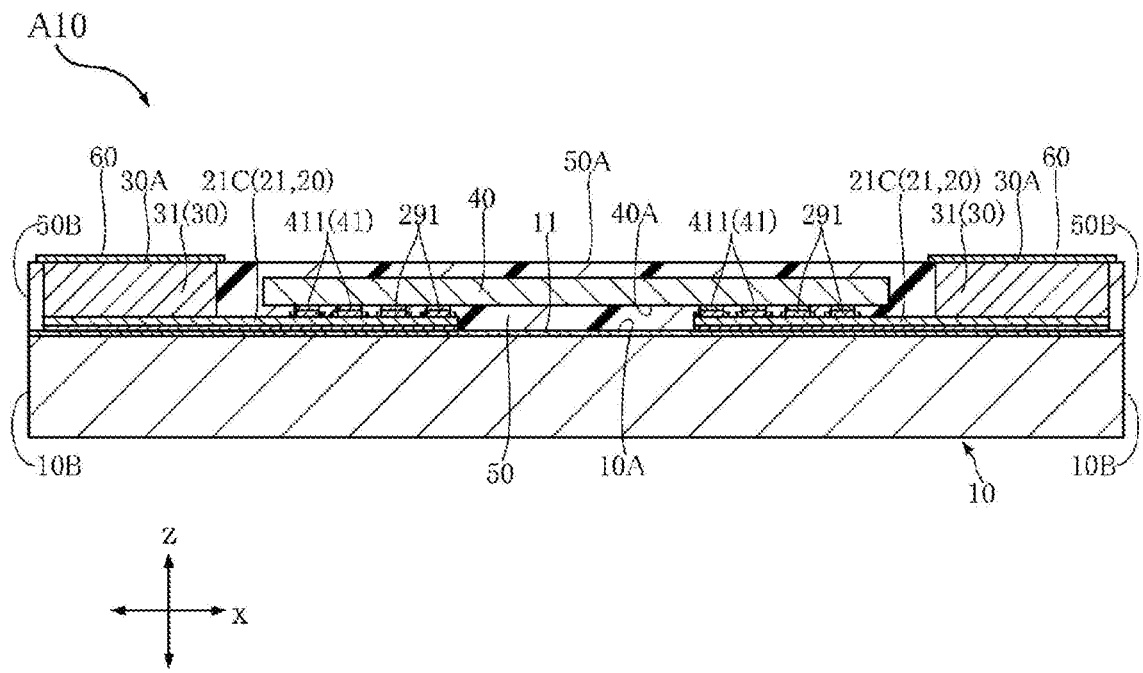
FIG. 4 is a sectional view taken along a line IV-IV in FIG. 2.
Figure 5:
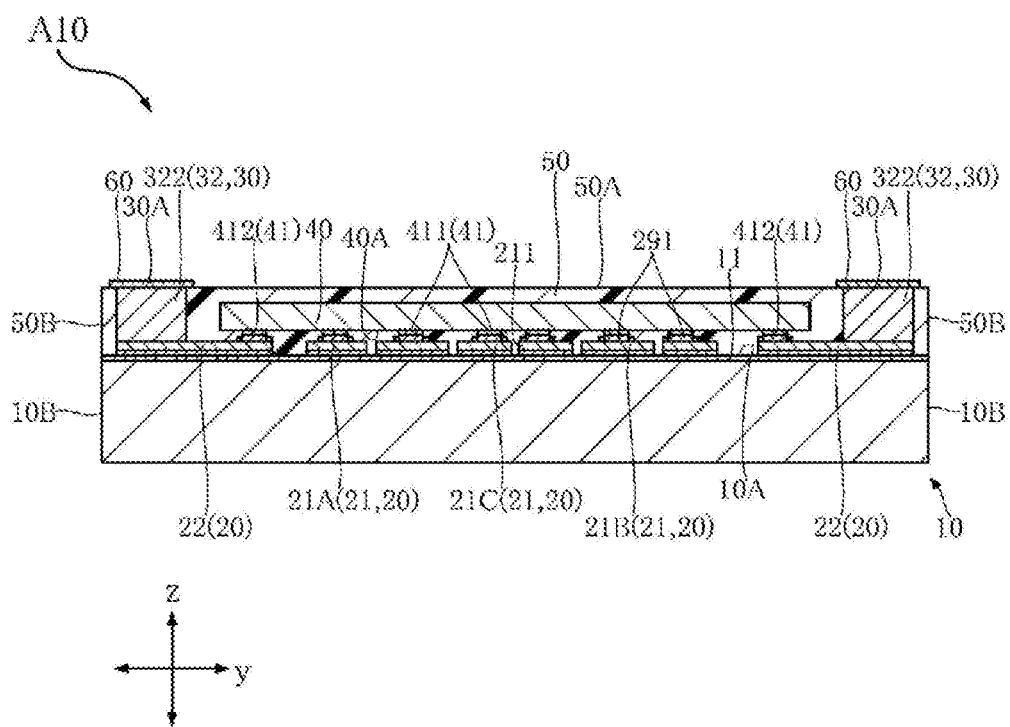
FIG. 5 is a sectional view taken along a line V-V in FIG. 2.

As shown in FIGS. 2, 4 and 5, the wirings 20 and the semiconductor element 40 are arranged on the substrate 10. The substrate 10 is made of a single crystal intrinsic semiconductor material. In the example shown by the semiconductor device A10, the intrinsic semiconductor material is silicon (Si). As shown in FIGS. 4 and 5, the substrate 10 includes an insulating film 11, a main surface 10A and a plurality of first end surfaces 10B.

As shown in FIGS. 4 and 5, the insulating film 11 is located at one end of the substrate 10 in the thickness direction z. In the example shown by the semiconductor device A10, the insulating film 11 includes an oxide film ($SiO_2$) and a nitride film ($Si_3N_4$) stacked on the oxide film.

As shown in FIGS. 4 and 5, the main surface 10A refers to the surface of the insulating film 11 facing the thickness direction z. The first end surfaces 10B are connected to the main surface 10A. As shown in FIGS. 2 to 5, each of the first end surfaces 10B faces either the first direction x or the second direction y.

Figure 6:
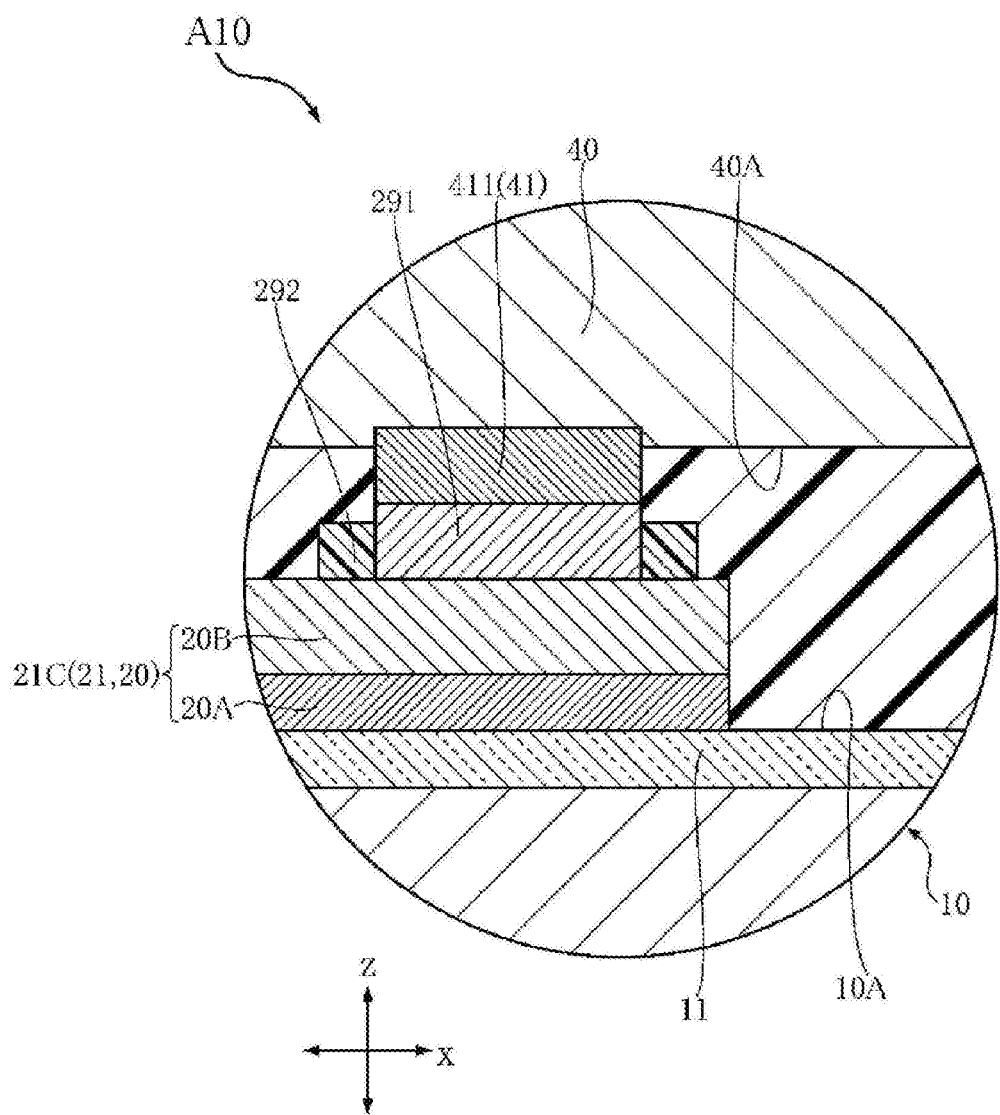
FIG. 6 is a partially enlarged view of FIG. 4.
Figure 7:
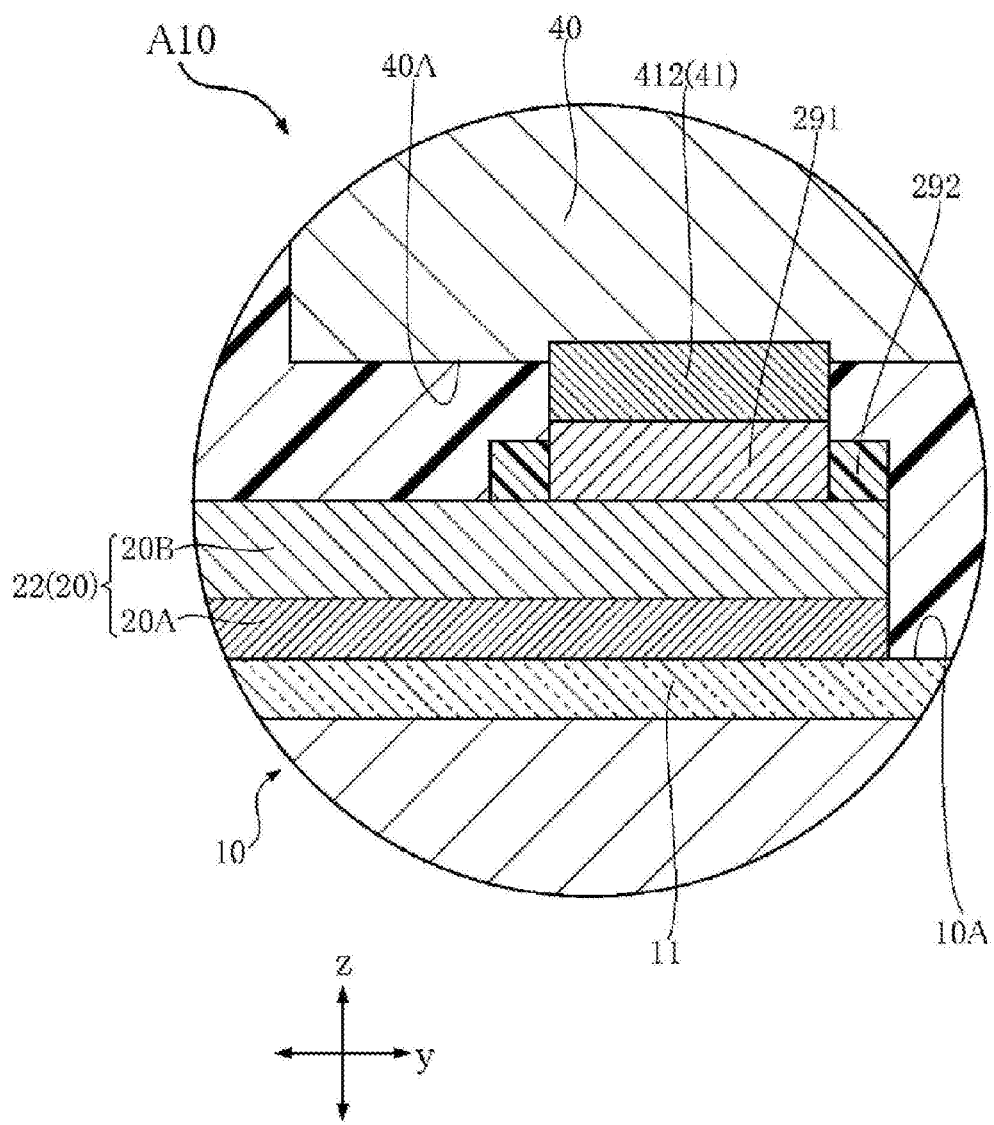
FIG. 7 is a partially enlarged view of FIG. 5.

As shown in FIGS. 2 to 5, the wirings 20 are arranged on the main surface 10A of the substrate 10. The wirings 20 constitute a part of a conductive path between the semiconductor element 40 and the wiring board on which the semiconductor device A10 is mounted. As shown in FIGS. 6 and 7, each of the wirings 20 includes a base layer 20A and a plating layer 20B. The base layer 20A is in contact with the main surface 10A. The base layer 20A includes a barrier layer in contact with main surface 10A and a seed layer stacked on the barrier layer. The barrier layer is made of, for example, titanium (Ti). The seed layer is made of, for example, copper (Cu). The plating layer 20B is stacked on the base layer 20A. In each of the wirings 20, the plating layer 20B is a main conductive path. The plating layer 20B is made of, for example, copper.

As shown in FIGS. 2 and 3, the wirings 20 include a plurality of first wirings 21 and a plurality of second wirings 22.

As shown in FIGS. 2 and 3, each of the first wirings 21 has a strip shape extending in the first direction x. The first wirings 21 are arranged along the second direction y on both sides of the main surface 10A of the substrate 10 in the first direction x. In the semiconductor device A10, the first wirings 21 includes four input wirings 21A, four output wirings 21B and two ground wirings 21C. The four input wirings 21A are located at the four corners of the first wirings 21, respectively. Each of the four output wirings 21B is located adjacent to one of the four input wirings 21A in the second direction y. The two ground wirings 21C are located between the four output wirings 21B in the second direction y.

Figure 8:
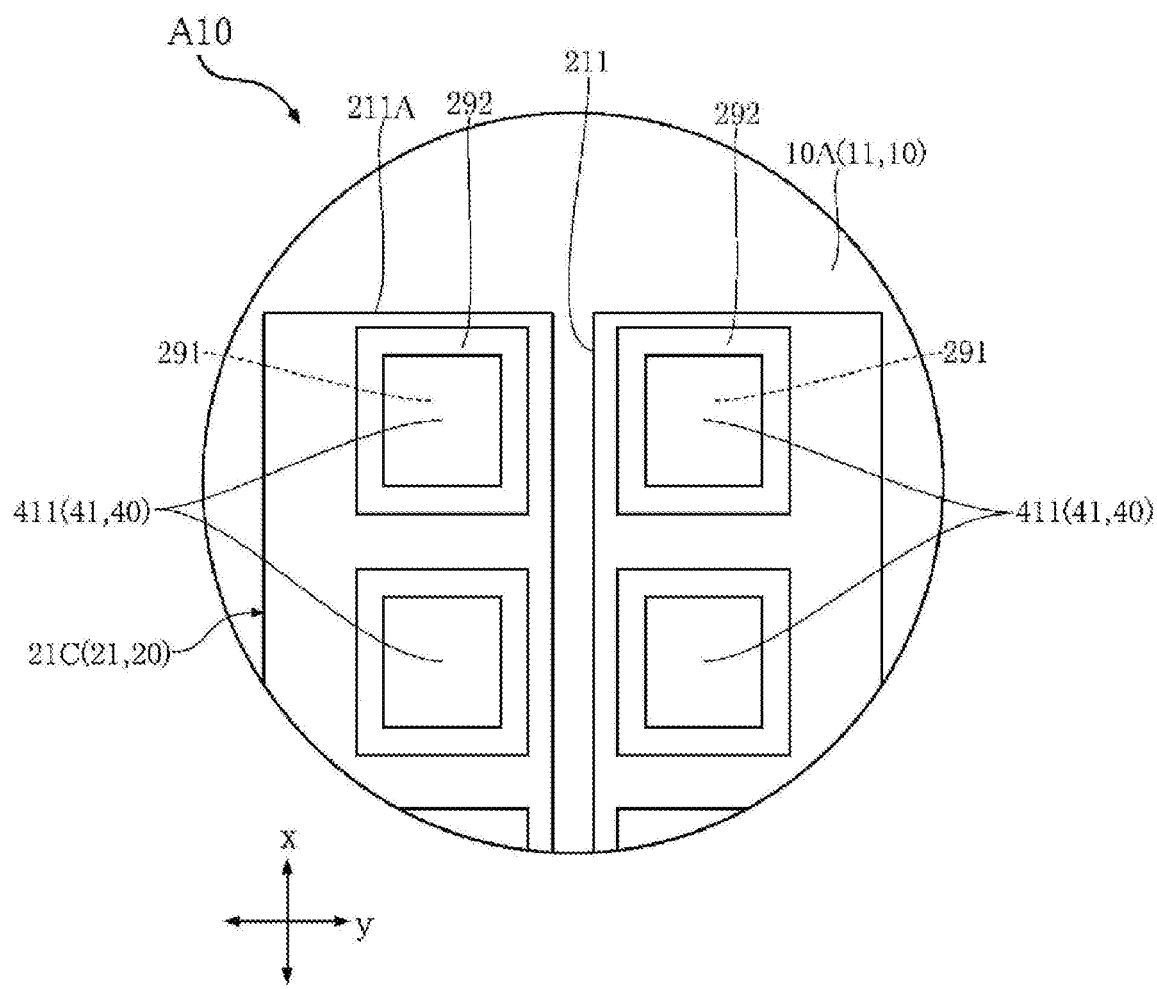
FIG. 8 is a partially enlarged view of FIG. 2 (transparent through a semiconductor element excluding a plurality of electrodes).

As shown in FIGS. 5 and 8, each of the two ground wirings 21C has a slit 211 passing therethrough in the thickness direction z. The slit 211 extends in the first direction x from an inner edge 211A located at an end of one of the two ground wirings 21C in the first direction x. The inner edge 211A of each of the two ground wirings 21C is opened by the slit 211.

As shown in FIGS. 2 and 3, the second wirings 22 are located on both sides of the main surface 10A of the substrate 10 in the second direction y. The first wirings 21 are located between the second wirings 22 in the second direction y. Each of the second wirings 22 has a strip shape.

As shown in FIGS. 2 to 5, the columnar wirings 30 are individually arranged on the wirings 20. The columnar wirings 30 are located outward from the semiconductor element 40 as viewed along the thickness direction z. Thereby, the semiconductor element 40 is surrounded by the columnar wirings 30. The columnar wirings 30 protrude in a direction away from the main surface 10A of the substrate 10 in the thickness direction z. As shown in FIGS. 1 and 2, the columnar wirings 30 are located inward from the peripheral edges of both the main surface 10A and the sealing resin 50 as viewed along the thickness direction z. The columnar wirings 30 are made of, for example, copper. Each of the columnar wirings 30 has a top surface 30A facing the same side as the main surface 10A.

As shown in FIGS. 2 and 3, the columnar wirings 30 include a plurality of first columnar portions 31 and a plurality of second columnar portions 32. When viewed along the thickness direction z, an area of each of the first columnar portions 31 is larger than an area of each of the second columnar portions 32. That is, the area of the top surface 30A of each of the first columnar portions 31 is larger than the area of the top surface 30A of each of the second columnar portions 32.

As shown in FIGS. 2 to 4, the first columnar portions 31 are individually arranged on the first wirings 21. The first columnar portions 31 are located on both sides of the substrate 10 in the first direction x. In addition, the first columnar portions 31 are arranged along the second direction y. In each of the first columnar portions 31, the dimension in the first direction x is larger than the dimension in the second direction y. Each of the first columnar portions 31 is rectangular as viewed along the thickness direction z. Accordingly, the top surface 30A of each of the first columnar portions 31 has a rectangular shape with the first direction x as a long side.

As shown in FIGS. 2, 3 and 5, the second columnar portions 32 are individually arranged on the second wirings 22. On the main surface 10A of the substrate 10, the second columnar portions 32 are located on both sides of the semiconductor element 40 and of the first columnar portions 31. In addition, the second columnar portions 32 are arranged along the first direction x.

As shown in FIGS. 2 and 3, the second columnar portions 32 include four corner portions 321 and a plurality of intermediate portions 322. The four corner portions 321 are located at the four corners of the main surface 10A of the substrate 10, respectively. The intermediate portions 322 are located between a pair of corner portions 321 located on one side or the other side in the second direction y among the four corner portions 321. When viewed along the thickness direction z, the area of each of the four corner portions 321 is larger than the area of each of the intermediate portions 322. That is, the area of the top surface 30A of each of the four corner portions 321 is larger than the area of the top surface 30A of each of the intermediate portions 322.

As shown in FIGS. 2, 4 and 5, the semiconductor element 40 is mounted on the wirings 20. The semiconductor element 40 has a back surface 40A and a plurality of electrodes 41. The back surface 40A faces the main surface 10A of the substrate 10. The electrodes 41 are formed on the back surface 40A. The semiconductor element 40 is a flip-chip mounting type element.

As shown in FIGS. 3, 6 and 7, a plurality of bonding layers 291 corresponding to the arrangement positions of the electrodes 41 are arranged on the wirings 20, respectively. The bonding layers 291 include, for example, a plurality of metal layers stacked in the order of a nickel (Ni) layer and an alloy layer containing tin (Sn) from the side closer to the plating layer 20B of the wirings 20. The alloy layer is made of, for example, a tin/silver (Ag)-based alloy or a tin/antimony (Sb)-based alloy. The electrodes 41 are bonded to the wirings 20 via the bonding layers 291.

As shown in FIGS. 3, 6 and 7, a plurality of protective layers 292 that individually surround the bonding layers 291 are formed on the wirings 20. The protective layers 292 have a frame shape. The protective layers 292 are made of, for example, a material containing polyimide. When the electrodes 41 are bonded to the wirings 20 via the bonding layers 291, the protective layers 292 prevent the electrodes 41 from being short-circuited when the melted bonding layers 291 spread over a wide area. In addition, the protective layers 292 have an effect of exhibiting self-alignment of the electrodes 41 with respect to the wirings 20.

As shown in FIGS. 2 to 7 (excluding FIG. 3), the electrodes 41 include a plurality of first electrodes 411 and a plurality of second electrodes 412. The first electrodes 411 are bonded to the first wirings 21. Accordingly, the first columnar portions 31 are electrically connected to the first electrodes 411 via the first wirings 21 and the bonding layers 291. The second electrodes 412 are bonded to the second wirings 22. Accordingly, the second columnar portions 32 are electrically connected to the second electrodes 412 via the second wirings 22 and the bonding layers 291.

As shown in FIG. 2, the width of each of the first wirings 21 in a section from any one of the first electrodes 411 to any one of the first columnar portions 31 is larger than the width of each of the second wirings 22 in a section from any one of the second electrodes 412 to any one of the second columnar portions 32.

As shown in FIG. 8, among the first wirings 21, the first electrodes 411 bonded to each of the ground wirings 21C having the slit 211 are located on both sides in the second direction y with the slit 211 sandwiched therebetween.

As shown in FIG. 2, the semiconductor element 40 includes a first circuit 401 and a second circuit 402. The first circuit 401 includes a plurality of switching circuits that perform power conversion. A plurality of currents having different sizes are output from the switching circuits. The first electrodes 411 are electrically connected to the first circuit 401. Accordingly, the first wirings 21 and the first columnar portions 31 are electrically connected to the first circuit 401. The first circuit 401 is electrically connected to the second circuit 402. The second circuit 402 includes a control circuit for controlling the switching circuits included in the first circuit 401. The second electrodes 412 are electrically connected to the second circuit 402. Accordingly, the second wirings 22 and the second columnar portions 32 are electrically connected to the second circuit 402. An electrical signal input to the second circuit 402 and an electrical signal output from the second circuit 402 flow through the second wirings 22.

As shown in FIG. 2, in the semiconductor device A10, the switching circuits included in the first circuit 401 include a first switching part 401A, a second switching part 401B, a third switching part 401C and a fourth switching part 401D. Each of the switching parts includes two switching elements that constitute upper and lower arm circuits, and two gate drivers that drive the two switching elements, respectively. The switching elements are, for example, metal-oxide-semiconductor field-effect transistors (MOSFETs).

The first switching part 401A and the second switching part 401B are electrically connected to two input wirings 21A, two output wirings 21B and a ground wiring 21C, which are located on one side (the lower side in FIG. 2) in the first direction x, among the first wirings 21. Two types of currents input to each of the first switching part 401A and the second switching part 401B flow through the two input wirings 21A located on one side in the first direction x. Two types of currents output from each of the first switching part 401A and the second switching part 401B flow through the two output wirings 21B located on one side in the first direction x. The ground wiring 21C located on one side in the first direction x is the grounds of the first switching part 401A and the second switching part 401B. The ground wiring 21C shares the grounds of the first switching part 401A and the second switching part 401B.

The third switching part 401C and the fourth switching part 401D are electrically connected to two input wirings 21A, two output wirings 21B and a ground wiring 21C, which are located on the other side (the upper side in FIG. 2) in the first direction x, among the first wirings 21. Two types of currents input to each of the third switching part 401C and the fourth switching part 401D flow through the two input wirings 21A located on the other side in the first direction x. Two types of currents output from each of the third switching part 401C and the fourth switching part 401D flow through the two output wirings 21B located on the other side in the first direction x. The ground wiring 21C located on the other side in the first direction x is the grounds of the third switching part 401C and the fourth switching part 401D. The ground wiring 21C shares the grounds of the third switching part 401C and the fourth switching part 401D. As described above, in the semiconductor device A10, the four types of currents (four channels) having different magnitudes can be output from the first switching part 401A, the second switching part 401B, the third switching part 401C and the fourth switching part 401D.

As shown in FIGS. 4 and 5, the sealing resin 50 is in contact with the main surface 10A of the substrate 10, while covering the wirings 20, the semiconductor element 40 and a portion of each of the columnar wirings 30. The sealing resin 50 is made of an insulating material including, for example, a black epoxy resin. The sealing resin 50 covers the wirings 20, the semiconductor element 40 and a portion of each of the columnar wirings 30.

As shown in FIGS. 1, 4 and 5, the sealing resin 50 has a mounting surface 50A and a plurality of second end surfaces 50B. The mounting surface 50A faces the same side as the main surface 10A of the substrate 10. When the semiconductor device A10 is mounted on the wiring board, the mounting surface 50A faces the wiring board. The top surfaces 30A of the columnar wirings 30 are exposed from the mounting surface 50A. The second end surfaces 50B are connected to the mounting surface 50A. Each of the second end faces 50B faces either the first direction x or the second direction y. Each of the second end faces 50B is flush with any one of the first end surfaces 10B of the substrate 10.

As shown in FIGS. 1, 4 and 5, the terminals 60 are individually arranged on the top surfaces 30A of the columnar wirings 30. The terminals 60 are exposed to the outside of the semiconductor device A10. When the terminals 60 are bonded to the wiring board by solder, the semiconductor device A10 is mounted on the wiring board. The size of each of the terminals 60 corresponds to the area of each of the top surfaces 30A of the columnar wirings 30. Accordingly, the size of each of the terminals 60 individually arranged on the top surfaces 30A of the first columnar portions 31 is larger than the size of each of the terminals 60 individually arranged on the top surfaces 30A of the second columnar portions 32. Each of the terminals 60 includes, for example, a plurality of metal layers stacked in the order of a nickel layer, a palladium (Pd) layer and a gold (Au) layer from the top surface 30A.

Next, an example of a method for manufacturing the semiconductor device A10 will be described with reference to FIGS. 9 to 21. The sectional positions in FIGS. 9 to 21 are the same as the sectional position in FIG. 4.

Figure 9:
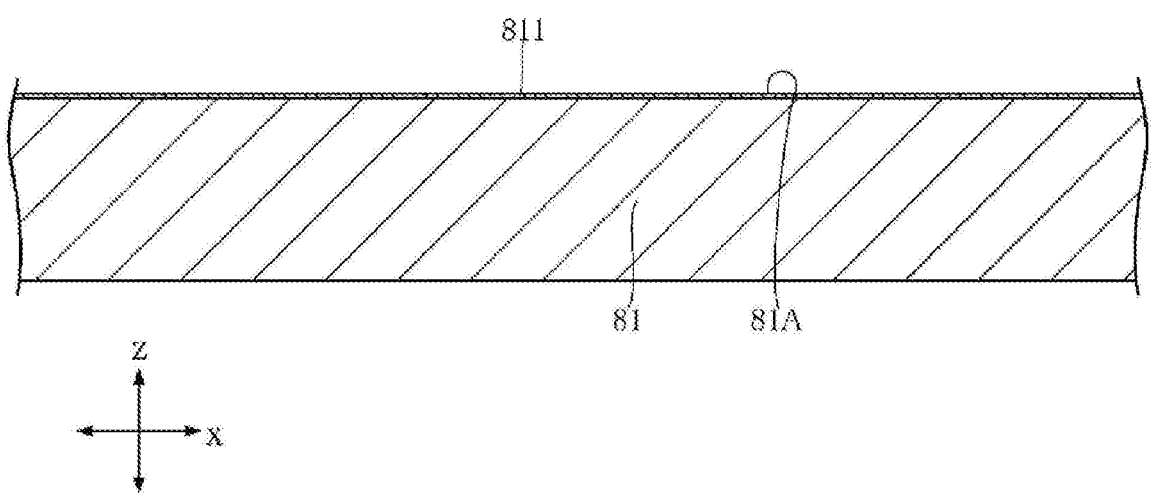
FIG. 9 is a sectional view for explaining a step of manufacturing the semiconductor device shown in FIG. 1.

First, as shown in FIG. 9, an insulating film 811 is formed on the surface of one side of a base 81 in the thickness direction z. The base 81 is a silicon wafer. The insulating film 811 is formed by depositing an oxide film on the surface of the substrate 81 by a thermal oxidation method and then depositing a nitride film on the oxide film by plasma chemical vapor deposition (CVD). A surface of the insulating film 811 formed in this step, which faces the thickness direction z, is called a main surface 81A of the base 81.

Next, as shown in FIG. 10, a base layer 82A covering the main surface 81A of the base 81 is formed. The base layer 82A is formed by depositing a barrier layer on the entire main surface 81A by a sputtering method and then depositing a seed layer on the barrier layer by a sputtering method. The barrier layer is made of titanium having a thickness of 100 nm to 300 nm. The seed layer is made of copper having a thickness of 200 nm to 600 nm.

Next, as shown in FIG. 11, a plurality of plating layers 82B are formed on the base layer 82A. The plating layers 82B are formed by electrolytic plating using the base layer 82A as a conductive path after performing lithography patterning on the base layer 82A. The plating layers 82B are made of copper having a thickness of 5 μm to 25 μm.

Figure 12:
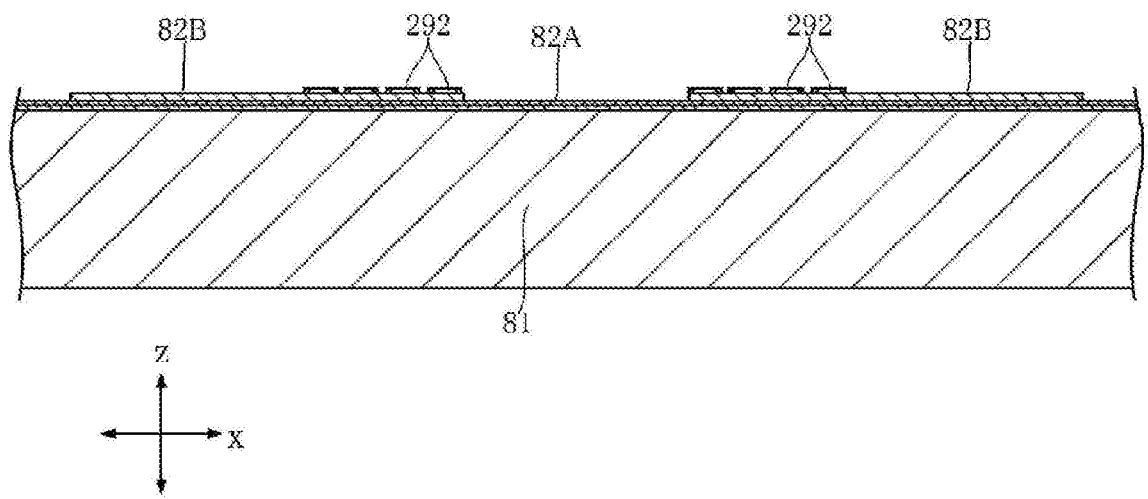
FIG. 12 is a sectional view for explaining a step of manufacturing the semiconductor device shown in FIG. 1.

Next, as shown in FIG. 12, a plurality of frame-shaped protective layers 292 are formed on the plating layers 82B. The protective layers 292 are formed by coating both of the plating layers 82B and the base layer 82A not covered with the plating layers 82B with photosensitive polyimide using a spin coater, and then performing lithography patterning on the photosensitive polyimide.

Figure 13:
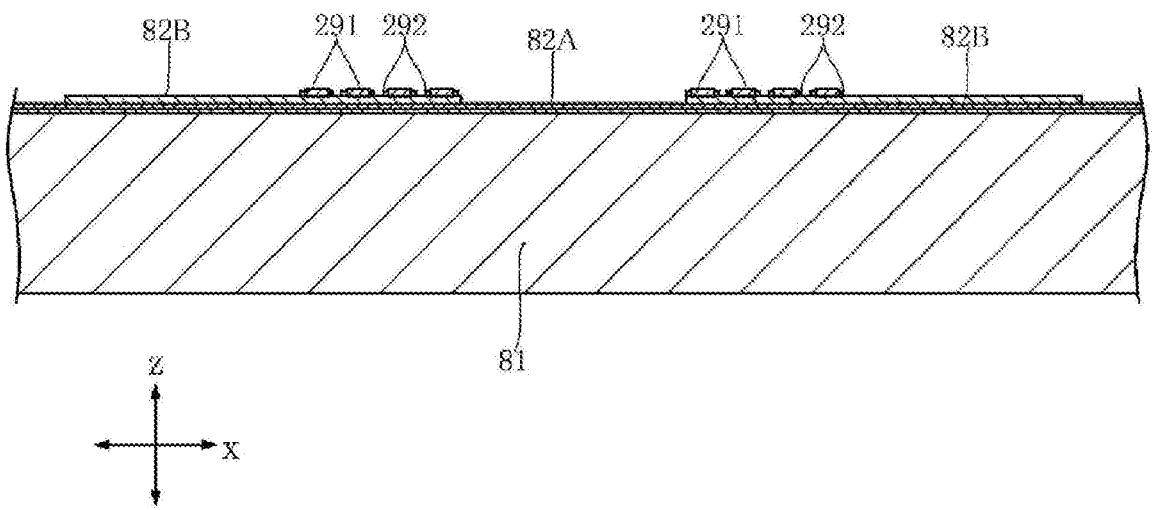
FIG. 13 is a sectional view for explaining a step of manufacturing the semiconductor device shown in FIG. 1.

Next, as shown in FIG. 13, a plurality of bonding layers 291 are formed on the plating layers 82B. The bonding layers 291 are formed so as to be surrounded by the protective layers 292. The bonding layers 291 are formed by electrolytic plating using the base layer 82A and the plating layers 82B as a conductive path after performing lithography patterning on both of the plating layers 82B and the base layer 82A not covered with the plating layers 82B.

Figure 14:
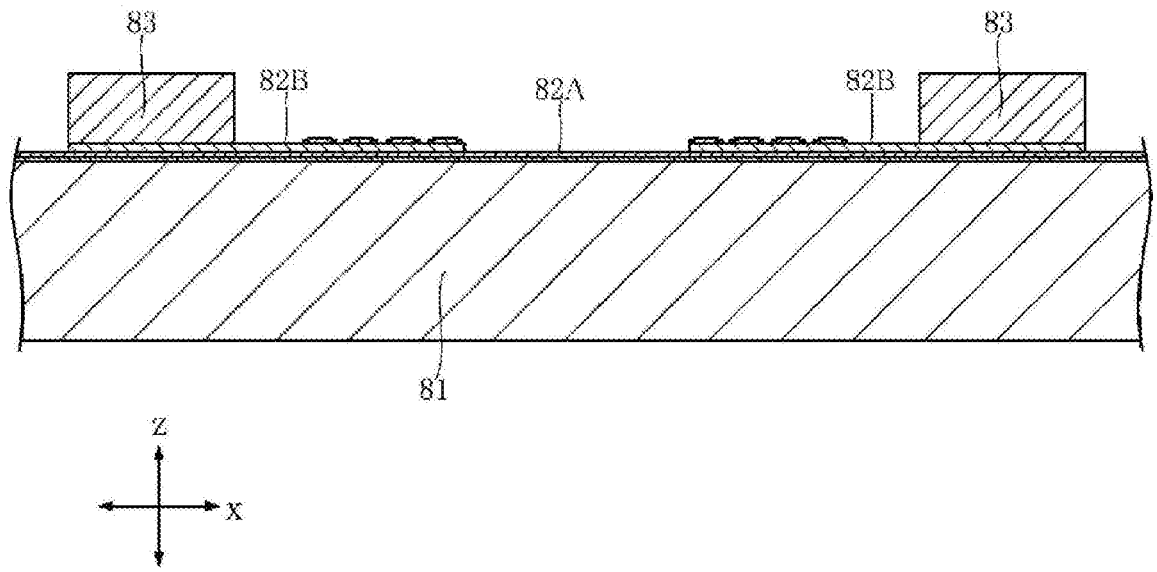
FIG. 14 is a sectional view for explaining a step of manufacturing the semiconductor device shown in FIG. 1.

Next, as shown in FIG. 14, a plurality of columnar conductors 83 are formed on the plating layers 82B. The columnar conductors 83 are made of copper. The columnar conductors 83 are formed by electrolytic plating using the base layer 82A and the plating layers 82B as a conductive path after performing lithography patterning.

Figure 15:
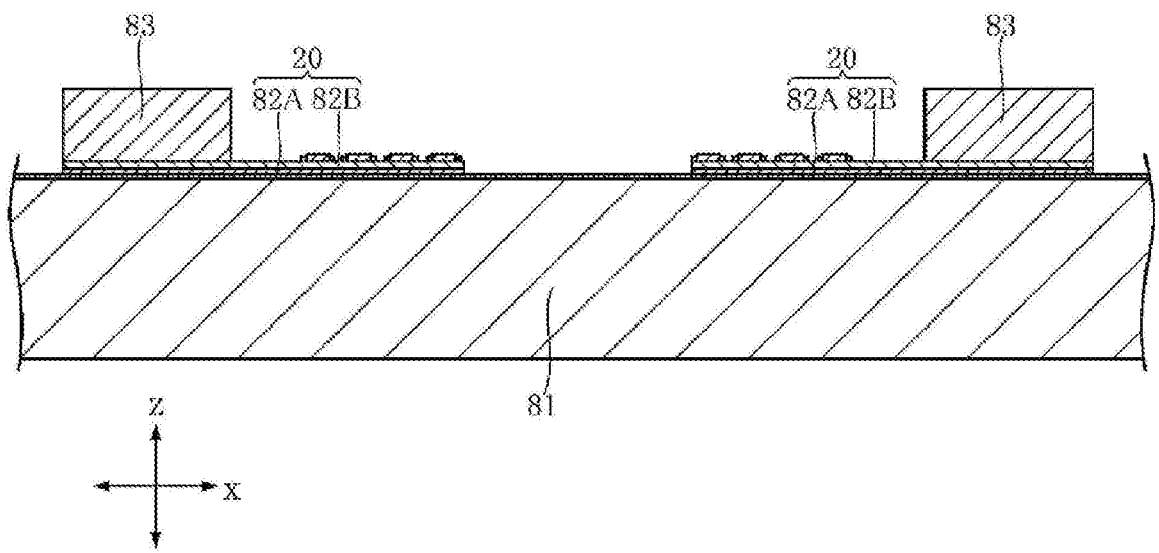
FIG. 15 is a sectional view for explaining a step of manufacturing the semiconductor device shown in FIG. 1.

Next, as shown in FIG. 15, a portion of the base layer 82A is removed. The removal target of the base layer 82A is a portion on which the plating layers 82B are not stacked. The base layer 82A is partially removed by wet etching using a mixed solution of sulfuric acid ($H_2SO_4$) and hydrogen peroxide ($H_2O_2$). Through this step, the remaining base layer 82A and the plating layers 82B stacked thereon become the wirings 20 of the semiconductor device A10.

Figure 16:
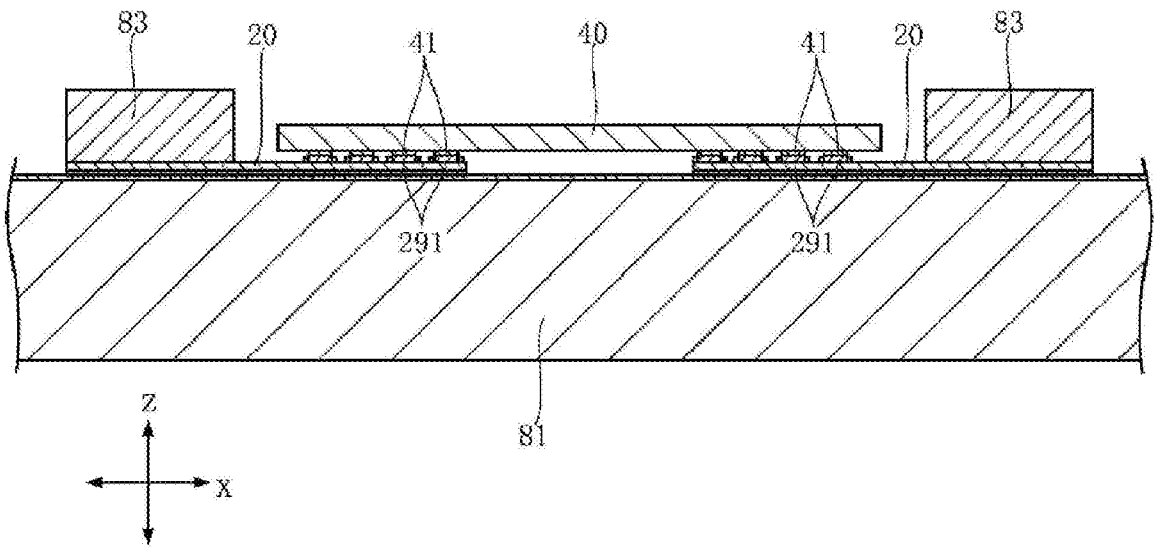
FIG. 16 is a sectional view for explaining a step of manufacturing the semiconductor device shown in FIG. 1.

Next, as illustrated in FIG. 16, the semiconductor element 40 is bonded to the bonding layers 291 formed on the wirings 20. In this step, the semiconductor element 40 is bonded by flip-chip bonding. First, using a collet (not shown), the electrodes 41 of the semiconductor element 40 are individually temporarily attached to the bonding layers 291. Next, the bonding layers 291 are melted by reflow. Finally, the bonding of the semiconductor elements 40 is completed by solidifying the bonding layers 291 by cooling.

Figure 17:
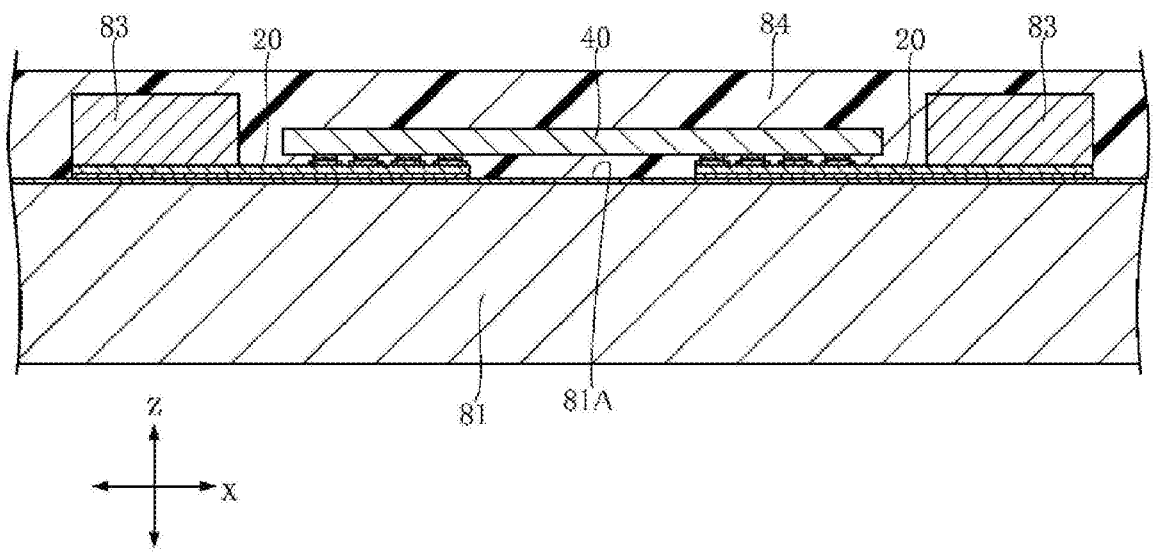
FIG. 17 is a sectional view for explaining a step of manufacturing the semiconductor device shown in FIG. 1.

Next, as shown in FIG. 17, a sealing resin 84 in contact with the main surface 81A of the base 81 is formed. The sealing resin 84 is made of a material containing a black epoxy resin. The sealing resin 84 is formed by compression molding. In this step, the wirings 20, the columnar conductors 83 and the semiconductor element 40 are covered with the sealing resin 84.

Figure 18:
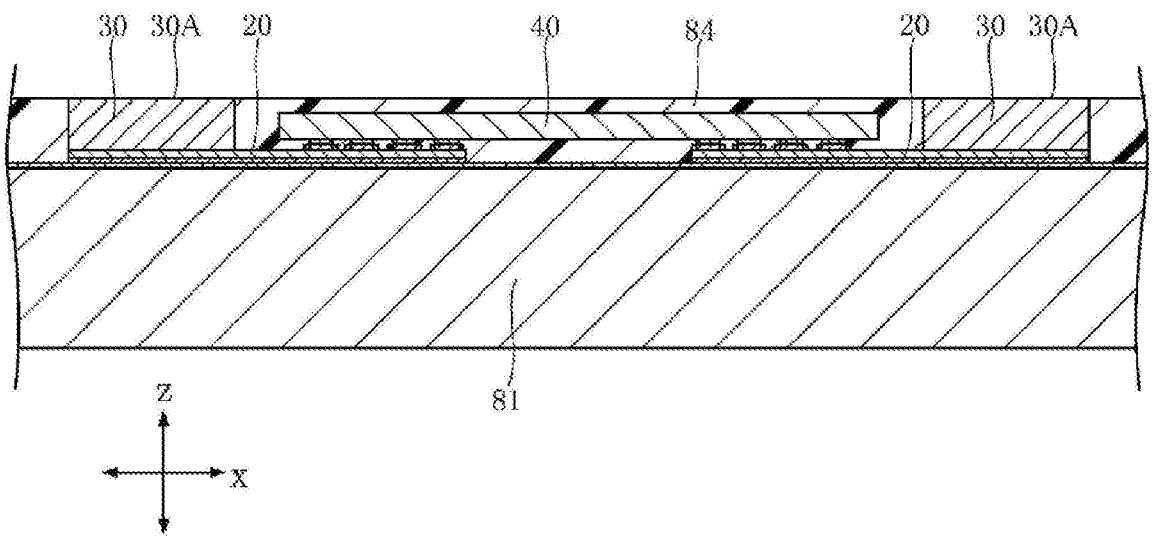
FIG. 18 is a sectional view for explaining a step of manufacturing the semiconductor device shown in FIG. 1.

Next, as shown in FIG. 18, one side of the sealing resin 84 in the thickness direction z is partially removed by mechanical grinding. In this step, the columnar conductors 83 are also partially removed. Through this step, the thickness of the sealing resin 84 is reduced. In addition, the columnar conductors 83 become the columnar wirings 30 of the semiconductor device A10. The top surface 30A exposed from the sealing resin 84 appears in each of the columnar wirings 30.

Figure 19:
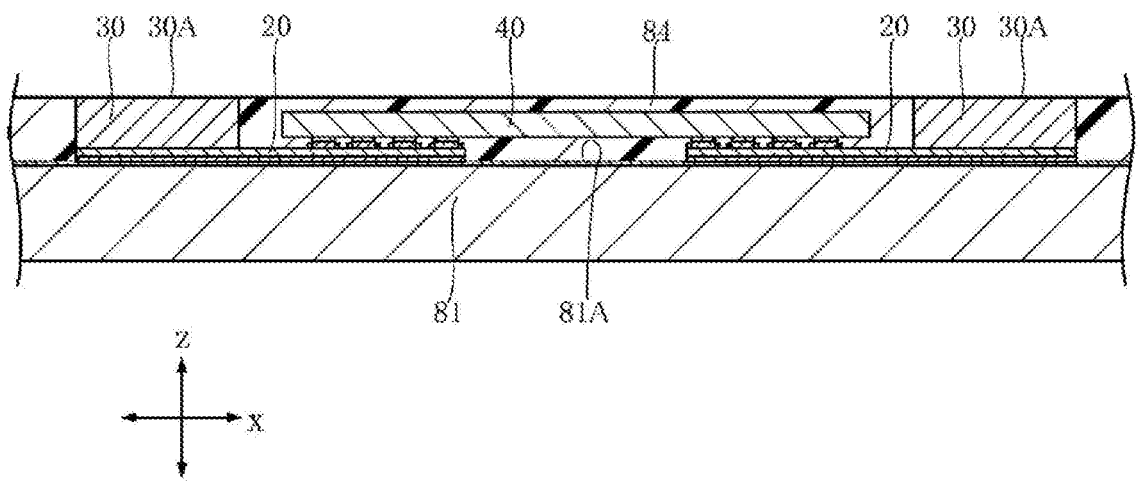
FIG. 19 is a sectional view for explaining a step of manufacturing the semiconductor device shown in FIG. 1.

Next, as shown in FIG. 19, a portion including the surface of the base 81 facing the opposite side to the main surface 81A is removed by mechanical grinding. Through this step, the thickness of the base 81 is reduced.

Figure 20:
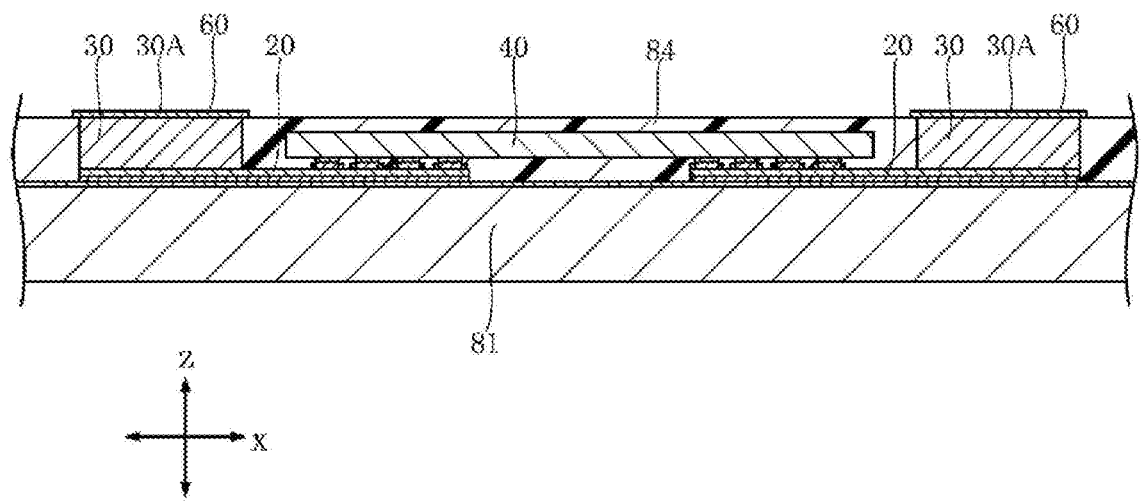
FIG. 20 is a sectional view for explaining a step of manufacturing the semiconductor device shown in FIG. 1.

Next, as shown in FIG. 20, a plurality of terminals 60 that individually contact the top surfaces 30A of the columnar wirings 30 are formed. The terminals 60 are formed by electroless plating.

Figure 21:
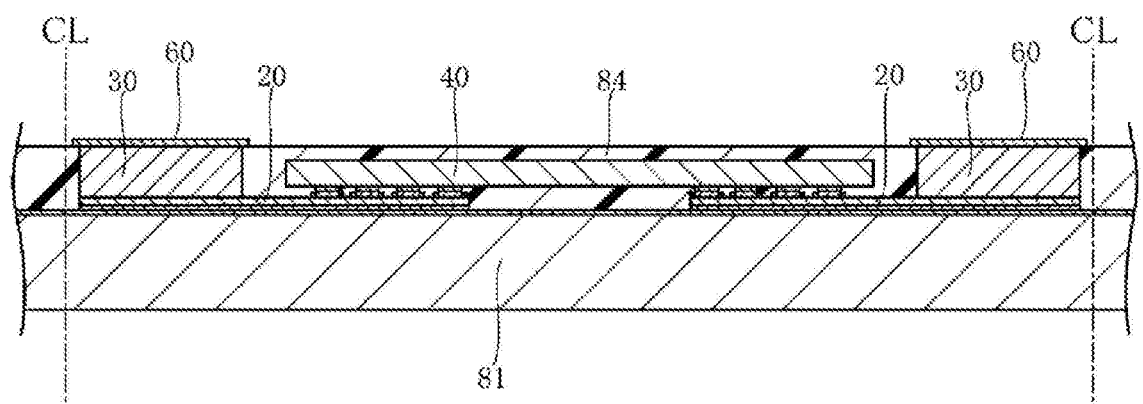
FIG. 21 is a sectional view for explaining a step of manufacturing the semiconductor device shown in FIG. 1.

Finally, as shown in FIG. 21, the base 81 and the sealing resin 50 are divided into a plurality of segments by being cut along a cutting line CL using a dicing blade or the like. Each of the segments includes one semiconductor element 40. Through this step, the base 81, which is a segment, becomes the substrate 10 of the semiconductor device A10, and the sealing resin 84, which is a segment, becomes the sealing resin 50 of the semiconductor device A10. The semiconductor device A10 is manufactured through the above steps.

Next, the operation and effects of the semiconductor device A10 will be described.

The semiconductor device A10 includes the wirings 20 arranged on the main surface 10A of the substrate 10, the semiconductor element 40 including the first electrodes 411 and the second electrodes 412 respectively bonded to the wirings 20, and the columnar wirings 30 arranged on the wirings 20. The columnar wirings 30 are located outward from the semiconductor element 40 as viewed along the thickness direction z, and protrude in a direction away from the main surface 10A in the thickness direction z. The columnar wirings 30 include the first columnar portions 31 electrically connected to the first electrodes 411 and the second columnar portions 32 electrically connected to the second electrodes 412. When viewed along the thickness direction z, the area of each of the first columnar portions 31 is larger than the area of each of the second columnar portions 32.

Accordingly, since the electrical resistance of each of the first columnar portions 31 is smaller than the electrical resistance of the second columnar portions 32, each of the first columnar portions 31 is configured to be suitable for flowing a relatively large current compared to each of the second columnar portions 32. In addition, the semiconductor element 40 is flip-chip-mounted on the wirings 20. In this case, the height of the columnar wirings 30 is reduced within a range that does not interfere with the semiconductor element 40, so that the thickness of the semiconductor device A10 can be further reduced. Therefore, according to the semiconductor device A10, it is possible to achieve the low profile of the semiconductor device A10 while adopting a configuration suitable for flowing a relatively large current. In addition, the reduction of the height of the columnar wirings 30 within the range that does not interfere with the semiconductor element 40 can be realized by removing a portion of the sealing resin 84 and portions of the columnar conductors 83 by mechanical grinding in the step shown in FIG. 18.

The semiconductor element 40 includes the first circuit 401 electrically connected to the first electrodes 411, and the second circuit 402 electrically connected to the second electrodes 412 and the first circuit 401. Accordingly, a relatively large current can be flown through the first circuit 401. Accordingly, the first circuit 401 can include a plurality of switching circuits.

The first columnar portions 31 are located on both sides of the semiconductor device A10 in the first direction x, and are arranged along the second direction y. In each of the first columnar portions 31, the dimension in the first direction x is larger than the dimension in the second direction y. Further, the second columnar portions 32 are located on both sides of the semiconductor device A10 in the second direction y, and are arranged along the first direction x. Accordingly, when viewed along the thickness direction z, the area of each of the first columnar portions 31 is larger than the area of each of the second columnar portions 32, whereas the dimension of the semiconductor device A10 in the second direction y can be suppressed. In addition, in the semiconductor device A10, a space necessary for arranging the second columnar portions 32 can be secured.

The second columnar portions 32 include the four corner portions 321 located respectively at the four corners of the main surface 10A of the substrate 10, and the intermediate portions 322 located between the pair of corner portions 321 located on one side or the other side of the semiconductor device A10 among the four corner portions 321. When viewed along the thickness direction z, the area of each of the four corner portions 321 is larger than the area of each of the intermediate portions 322. Accordingly, a thermal stress concentration in the four corners 321 due to an influence of heat generated when the semiconductor device A10 is used can be reduced. Therefore, it is possible to suppress an occurrence of cracks in solder interposed between the semiconductor device A10 and the wiring board on which the semiconductor device A10 is mounted.

The wirings 20 include the first wirings 21 to which the first electrodes 411 are bonded and on which the first columnar portions 31 are arranged, and the second wirings 22 to which the second electrodes 412 are bonded and on which the second columnar portions 32 are arranged. The width of each of the first wirings 21 extending from any one of the first electrodes 411 to any one of the first columnar portions 31 is larger than the width of each of the second wirings 22 extending from any one of the second electrodes 412 to any one of the second columnar portions 32. Accordingly, the electrical resistance of each of the first wirings 21 in a section from the first electrodes 411 to the first columnar portions 31 is smaller than the electrical resistance of each of the second wirings 22 in a section from the second electrodes 412 to the second columnar portions 32. This is suitable for flowing a relatively large current through each of the first columnar portions 31 as compared with each of the second columnar portions 32.

At least one of the first wirings 21 has the slit 211 that passes through in the thickness direction z. The slit 211 extends in the first direction x from the inner edge 211A located at the end of any one of the first wirings 21 in the first direction x. In the semiconductor device A10, each of the two ground wirings 21C has the slit 211. In the semiconductor device A10, one of the two ground wirings 21C shares the grounds of the first switching part 401A and the second circuit 402 of the first circuit 401. In the ground wirings 21C, the first electrodes 411 electrically connected to the first switching part 401A and the first electrodes 411 electrically connected to the second switching part 401B are located on both sides in the second direction y across with the slit 211 interposed therebetween. Thus, when the semiconductor device A10 is used, it is possible to prevent noise generated from both the first switching part 401A and the second switching part 401B from interfering with these two switching parts. This also has the same effect in the other ground wiring 21C sharing the grounds of the third switching part 401C and the fourth switching part 401D of the first circuit 401.

The semiconductor device A10 includes the sealing resin 50 that is in contact with the main surface 10A of the substrate 10 and covers the wirings 20, the semiconductor element 40 and a portion of each of the columnar wirings 30. The columnar wirings 30 are located inward from the peripheral edges of both of the main surface 10A and the sealing resin 50 as viewed along the thickness direction z. Then, in the step shown in FIG. 21, when the base 81 and the sealing resin 84 are cut into segments, it is possible to prevent the columnar wirings 30 from being damaged.

Second Embodiment

Figure 22:
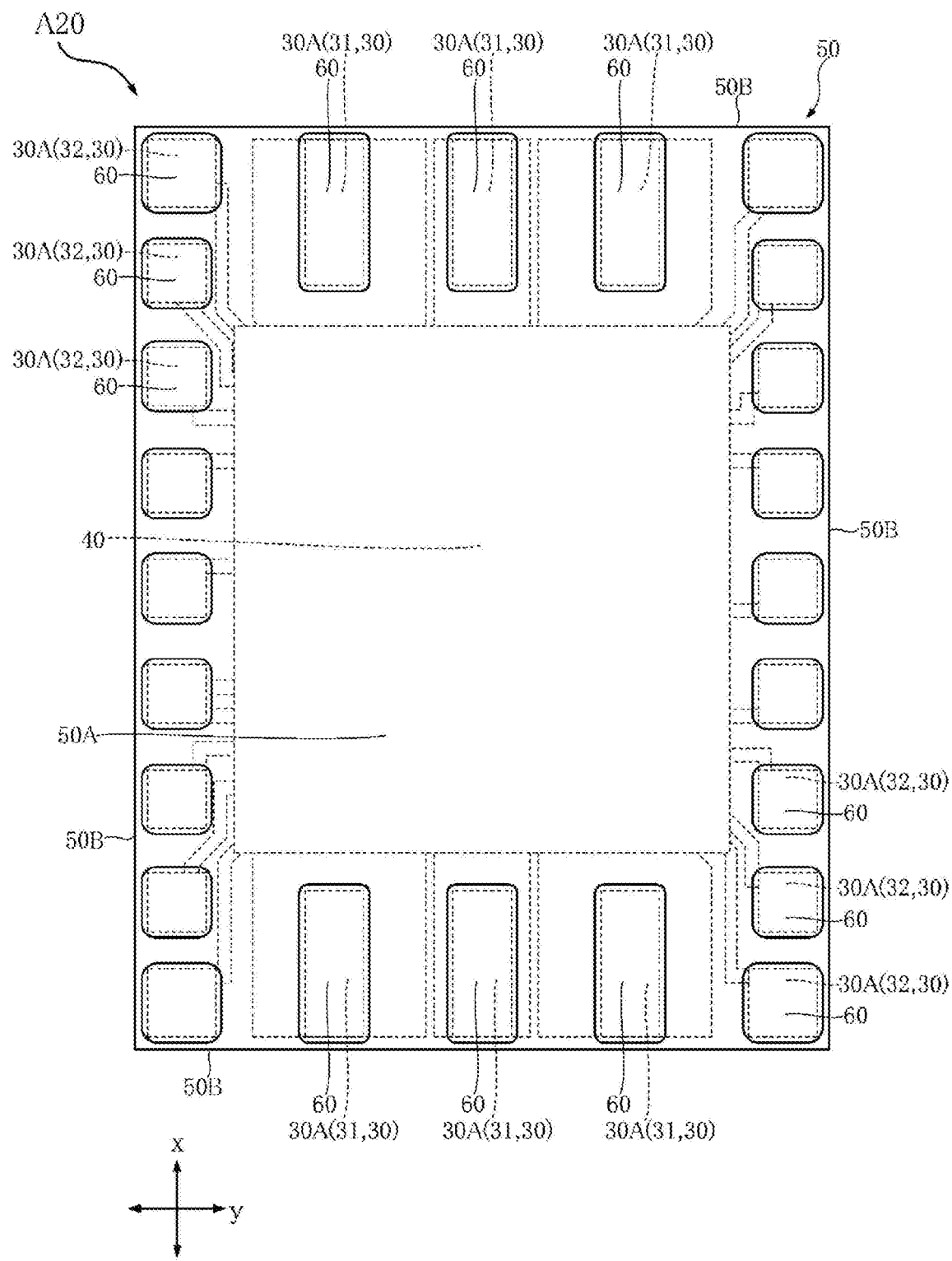
FIG. 22 is a bottom view of a semiconductor device according to a second embodiment of the present disclosure.

A semiconductor device A20 according to a second embodiment of the present disclosure will be described with reference to FIGS. 22 and 24. In these figures, the same or similar elements as those of the above-described semiconductor device A10 are denoted by the same reference numerals, and explanation of which will not be repeated. Here, in FIG. 23, the sealing resin 50 and the plurality of terminals 60 of FIG. 22 are penetrated for convenience of understanding. In FIG. 24, the semiconductor element 40 of FIG. 23 is penetrated for convenience of understanding, and the semiconductor element 40 is indicated by an imaginary line.

The semiconductor device A20 is different from the above-described semiconductor device A10 in terms of the configurations of the first wirings 21, the first columnar portions 31, the semiconductor element 40 and the terminals 60.

Figure 23:
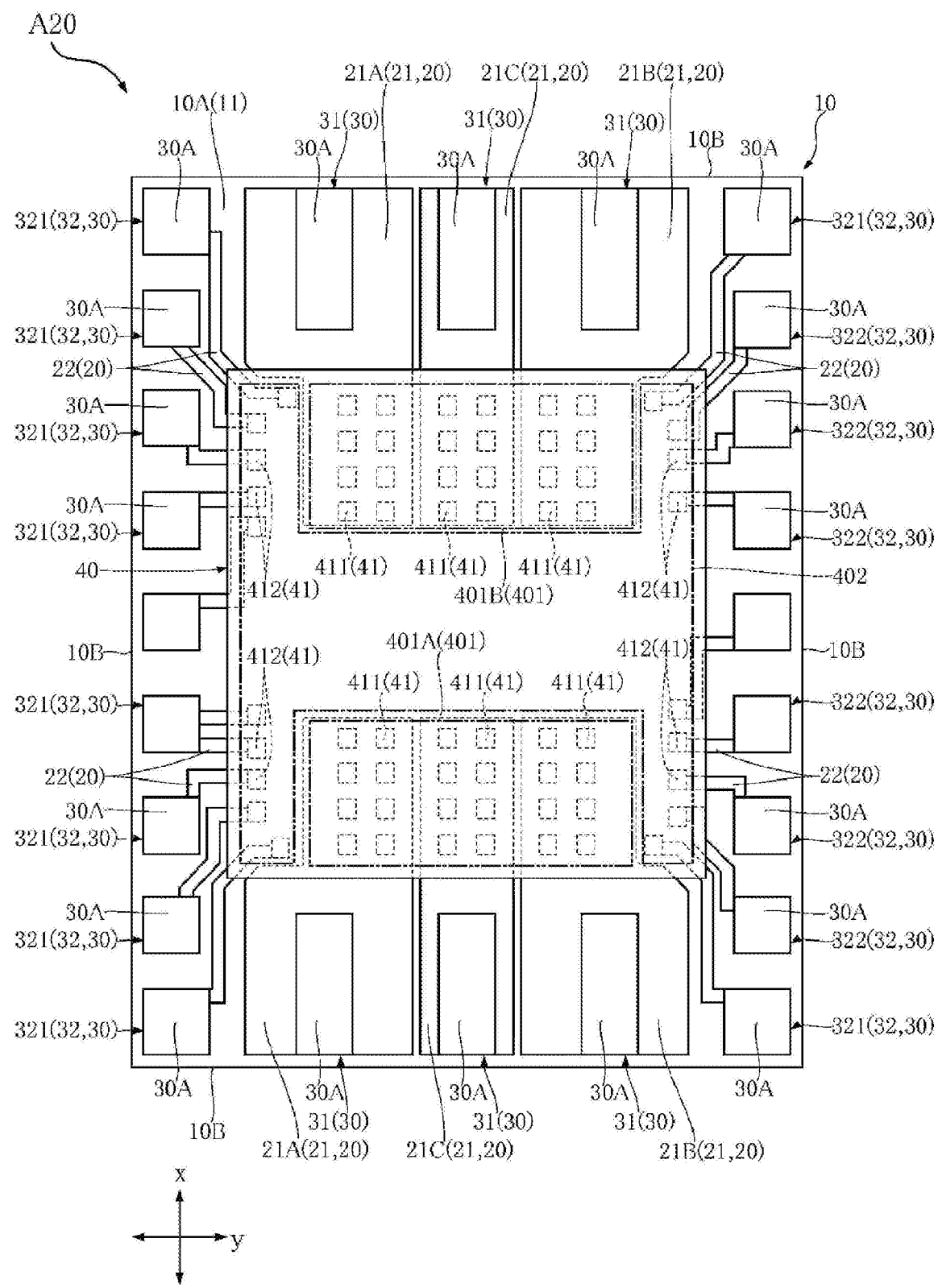
FIG. 23 is a bottom view in which a sealing resin and a plurality of terminals of FIG. 22 are penetrated.
Figure 24:
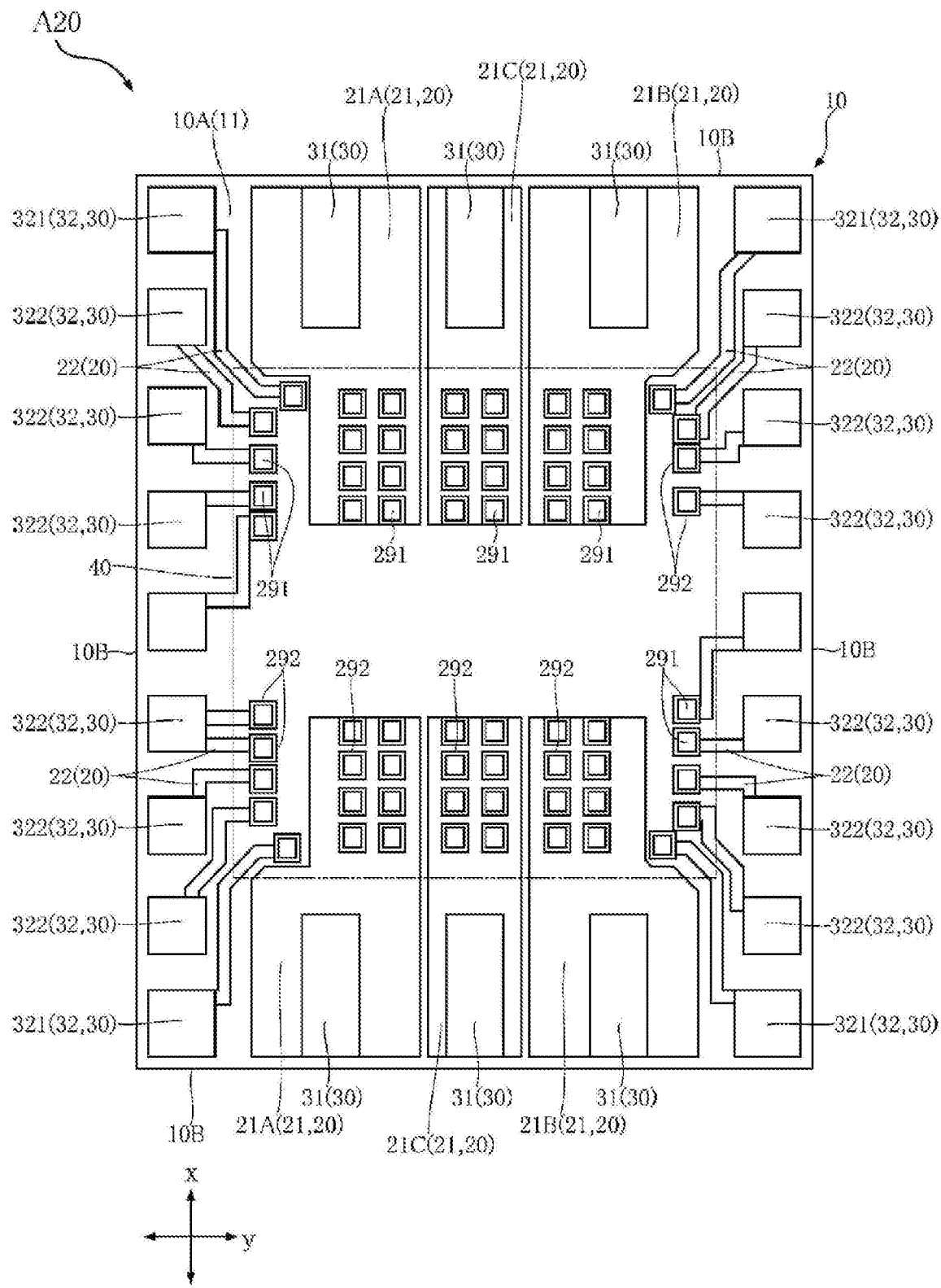
FIG. 24 is a bottom view in which a semiconductor element of FIG. 23 is penetrated.

As shown in FIGS. 23 and 24, in the semiconductor device A20, the first wirings 21 includes two input wirings 21A, two output wirings 21B and two ground wirings 21C. The two input wirings 21A are located on one side (the left side in FIGS. 23 and 24) in the second direction y. When viewed along the thickness direction z, an area of each of the two input wirings 21A is larger than an area of each of the four input wirings 21A of the semiconductor device A10. The two output wirings 21B are located on the other side (the right side in FIGS. 23 and 24) in the second direction y. When viewed along the thickness direction z, the area of each of the two input wirings 21A is larger than the area of each of the four output wirings 21B of the semiconductor device A10. The two ground wirings 21C are located between the two input wirings 21A and the two output wirings 21B in the second direction y. In the semiconductor device A20, the slit 211 is not formed in each of the first wirings 21.

As shown in FIGS. 23 and 24, a plurality of first columnar portions 31 is individually arranged on the first wirings 21. Accordingly, in the semiconductor device A20, the number of first columnar portions 31 is half the number of first columnar portions 31 of the semiconductor device A10.

As shown in FIG. 23, in the semiconductor device A20, a plurality of switching circuits included in the first circuit 401 includes a first switching part 401A and a second switching part 401B.

The first switching part 401A is electrically connected to the input wiring 21A, the output wiring 21B and the ground wiring 21C, which are located on one side (the lower side in FIG. 23) in the first direction x, among the first wirings 21. A current input to the first switching part 401A flows through the input wiring 21A located on one side in the first direction x. A current output from the first switching part 401A flows through the output wiring 21B located on one side in the first direction x. The ground wiring 21C located on one side in the first direction x is the ground of the first switching part 401A.

The second switching part 401B is electrically connected to the input wiring 21A, the output wiring 21B and the ground wiring 21C, which are located on the other side (the upper side in FIG. 23) in the first direction x, among the first wirings 21. A current input to the second switching part 401B flows through the input wiring 21A located on the other side in the first direction x. A current output from the second switching part 401B flows through the output wiring 21B located on the other side in the first direction x. The ground wiring 21C located on the other side in the first direction x is the ground of the second switching part 401B. As described above, the semiconductor device A20 can output two types of currents (two channels) having different magnitudes from the first switching part 401A and the second switching part 401B.

As shown in FIG. 23, in the semiconductor device A20, the number of first electrodes 411 electrically connected to each of the first switching part 401A and the second switching part 401B is twice the number of first electrodes 411 electrically connected to each of the first switching part 401A and the second switching part 401B in the semiconductor device A10.

As shown in FIGS. 23 and 24, in the semiconductor device A20, the number of first columnar portions 31 is half the number of first columnar portions 31 in the semiconductor device A10. Therefore, as shown in FIG. 22, in the semiconductor device A20, the number of terminals 60 individually arranged on the top surfaces 30A of the first columnar portions 31 is half the number of terminals 60 individually arranged on the top surfaces 30A of the first columnar portions 31 in the semiconductor device A10.

Next, operation and effects of the semiconductor device A20 will be described.

As in the semiconductor device A10, the semiconductor device A20 includes the wirings 20 arranged on the main surface 10A of the substrate 10, the semiconductor element 40 including the first electrodes 411 and the second electrodes 412 respectively bonded to the wirings 20, and the columnar wirings 30 arranged on the wirings 20. The columnar wirings 30 are located outward from the semiconductor element 40 as viewed along the thickness direction z, and protrude in a direction away from the main surface 10A in the thickness direction z. The columnar wirings 30 include the first columnar portions 31 electrically connected to the first electrodes 411 and the second columnar portions 32 electrically connected to the second electrodes 412. When viewed along the thickness direction z, the area of each of the first columnar portions 31 is larger than the area of each of the second columnar portions 32. Therefore, according to the semiconductor device A20, it is also possible to achieve a low profile of the semiconductor device A20 while adopting a configuration suitable for flowing a relatively large current.

In the semiconductor device A20, two types of currents (two channels) having different magnitudes can be output from the first switching part 401A and the second switching part 401B of the first circuit 401. On the other hand, in the semiconductor device A10, four types of currents (four channels) having different magnitudes can be output from the first switching part 401A, the second switching part 401B, the third switching part 401C and the fourth switching part 401D of the first circuit 401. In this way, in the first circuit 401 including a plurality of switching circuits, the number of types of output current can be freely set by changing the number of switching circuits. The present disclosure is applicable regardless of the number of switching circuits.

The present disclosure is not limited to the above-described embodiments. The specific configuration of each part of the present disclosure can be changed in design in various ways.

According to the present disclosure in some embodiments, it is possible to achieve a low profile of a semiconductor device while adopting a configuration suitable for flowing a relatively large current.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a substrate having a main surface facing a thickness direction;
   a plurality of wirings arranged on the main surface;
   a semiconductor element having a back surface facing the main surface and a plurality of electrodes formed on the back surface, wherein the plurality of electrodes are bonded to the plurality of wirings; and
   a plurality of columnar wirings that are located outside the semiconductor element as viewed along the thickness direction, protrude in a direction away from the main surface in the thickness direction, and are arranged on the plurality of wirings,
   wherein the semiconductor element includes a first circuit and a second circuit electrically connected to the first circuit,
   wherein the plurality of electrodes include a plurality of first electrodes electrically connected to the first circuit and a plurality of second electrodes electrically connected to the second circuit,
   wherein the plurality of columnar wirings include a plurality of first columnar portions electrically connected to the plurality of first electrodes and a plurality of second columnar portions electrically connected to the plurality of second electrodes,
   wherein an area of each of the plurality of first columnar portions is larger than an area of each of the plurality of second columnar portions when viewed along the thickness direction, and
   wherein the plurality of first columnar portions are located on both sides of the semiconductor element in a first direction orthogonal to the thickness direction, and are arranged along a second direction orthogonal to both of the thickness direction and the first direction.

2. The semiconductor device of claim 1, wherein the first circuit includes a plurality of switching circuits.

3. The semiconductor device of claim 2, wherein a plurality of currents having different magnitudes are output from the plurality of switching circuits.

4. The semiconductor device of claim 3, wherein the second circuit includes a control circuit.

5. The semiconductor device of claim 1, wherein, in each of the plurality of first columnar portions, a dimension in the first direction is larger than a dimension in the second direction.

6. The semiconductor device of claim 5, wherein each of the plurality of first columnar portions has a rectangular shape when viewed along the thickness direction.

7. The semiconductor device of claim 1, wherein the plurality of second columnar portions are located on both sides of the semiconductor element and of the plurality of first columnar portions in the second direction, and are arranged along the first direction.

8. The semiconductor device of claim 7, wherein the plurality of second columnar portions include four corner portions located at four corners of the main surface, and include a plurality of intermediate portions located between a pair of corner portions, which are located on one side or the other side in the second direction, among the four corner portions, and wherein an area of each of the four corner portions is larger than an area of each of the plurality of intermediate portions when viewed along the thickness direction.

9. The semiconductor device of claim 1, wherein the plurality of wirings include a plurality of first wirings to which the plurality of first electrodes are bonded and on which the plurality of first columnar portions are arranged, and include a plurality of second wirings to which the plurality of second electrodes are bonded and on which the plurality of second columnar portions are arranged, and
wherein a width of each of the plurality of first wirings in a section from any one of the plurality of first electrodes to any one of the plurality of first columnar portions is larger than a width of each of the plurality of second wirings in a section from any one of the plurality of second electrodes to any one of the plurality of second columnar portions.

10. The semiconductor device of claim 9, wherein each of the plurality of first wirings extends in the first direction.

11. The semiconductor device of claim 10, wherein at least one of the plurality of first wirings has a slit passing through the at least one of the plurality of first wirings in the thickness direction, and
wherein the slit extends in the first direction from an inner edge located at an end of any one of the plurality of first wirings in the first direction.

12. The semiconductor device of claim 11, wherein the plurality of first electrodes bonded to any one of the plurality of first wirings having the slit are located on both sides in the second direction with the slit interposed between the plurality of first electrodes.

13. The semiconductor device of claim 1, further comprising: a sealing resin that is in contact with the main surface and covers the plurality of wirings, the semiconductor element and a portion of each of the plurality of columnar wirings,
wherein each of the plurality of columnar wirings has a top surface facing the same side as the main surface, and
wherein the top surfaces of the plurality of columnar wirings are exposed from the sealing resin.

14. The semiconductor device of claim 13, wherein the plurality of columnar wirings are located inward from peripheral edges of both of the main surface and the sealing resin when viewed along the thickness direction.

15. The semiconductor device of claim 13, further comprising:
a plurality of terminals,
wherein the plurality of terminals are individually arranged on the top surfaces of the plurality of columnar wirings.

16. The semiconductor device of claim 1, wherein the substrate is made of a single crystal intrinsic semiconductor material.

17. A semiconductor device comprising:
a substrate having a main surface facing a thickness direction;
a plurality of wirings arranged on the main surface;
a semiconductor element having a back surface facing the main surface and a plurality of electrodes formed on the back surface, wherein the plurality of electrodes are bonded to the plurality of wirings; and
a plurality of columnar wirings that are located outside the semiconductor element as viewed along the thickness direction, protrude in a direction away from the main surface in the thickness direction, and are arranged on the plurality of wirings,
wherein the semiconductor element includes a first circuit and a second circuit electrically connected to the first circuit,
wherein the plurality of electrodes include a plurality of first electrodes electrically connected to the first circuit and a plurality of second electrodes electrically connected to the second circuit,
wherein the plurality of columnar wirings include a plurality of first columnar portions electrically connected to the plurality of first electrodes and a plurality of second columnar portions electrically connected to the plurality of second electrodes,
wherein the first circuit includes a plurality of switching circuits,
wherein a plurality of currents having different magnitudes are output from the plurality of switching circuits,
wherein an area of each of the plurality of first columnar portions is larger than an area of each of the plurality of second columnar portions when viewed along the thickness direction, and
wherein the plurality of first columnar portions are located on both sides of the semiconductor element in a first direction orthogonal to the thickness direction, and are arranged along a second direction orthogonal to both of the thickness direction and the first direction.

18. The semiconductor device of claim 17, further comprising:
a sealing resin that is in contact with the main surface and covers the plurality of wirings, the semiconductor element and a portion of each of the plurality of columnar wirings,
wherein each of the plurality of columnar wirings has a top surface facing the same side as the main surface, and
wherein the top surfaces of the plurality of columnar wirings are exposed from the sealing resin.

19. The semiconductor device of claim 17, wherein the substrate is made of a single crystal intrinsic semiconductor material.

* * * * *